US012633896B2

(12) United States Patent
Konaka

(10) Patent No.: US 12,633,896 B2
(45) Date of Patent: May 19, 2026

(54) ACOUSTIC WAVE ELEMENT, ACOUSTIC WAVE FILTER DEVICE, AND MULTIPLEXER

(71) Applicant: Murata Manufacturing Co., Ltd., Nagaokakyo (JP)

(72) Inventor: Yohei Konaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 179 days.

(21) Appl. No.: 18/399,791

(22) Filed: Dec. 29, 2023

(65) Prior Publication Data

US 2024/0137003 A1 Apr. 25, 2024
US 2024/0235524 A9 Jul. 11, 2024

Related U.S. Application Data

(63) Continuation of application No. PCT/JP2022/026984, filed on Jul. 7, 2022.

(30) Foreign Application Priority Data

Jul. 8, 2021 (JP) ................................. 2021-113671

(51) Int. Cl.
*H03H 9/135* (2006.01)
*H03H 9/02* (2006.01)
(Continued)

(52) U.S. Cl.
CPC .......... *H03H 9/135* (2013.01); *H03H 9/0211* (2013.01); *H03H 9/58* (2013.01); *H03H 9/703* (2013.01)

(58) Field of Classification Search
CPC ........ H03H 9/135; H03H 9/0211; H03H 9/58; H03H 9/703; H03H 9/02574; H03H 9/14576
(Continued)

(56) References Cited

U.S. PATENT DOCUMENTS

2008/0238576 A1 10/2008 Takahashi et al.
2016/0056791 A1 2/2016 Shimizu et al.
(Continued)

FOREIGN PATENT DOCUMENTS

JP 2008252678 A 10/2008
JP 2015073207 A 4/2015
(Continued)

OTHER PUBLICATIONS

International Search Report in PCT/JP2022/026984, mailed Oct. 11, 2022, 3 pages.
(Continued)

*Primary Examiner* — Jorge L Salazar, Jr.
(74) *Attorney, Agent, or Firm* — Keating & Bennett, LLP

(57) ABSTRACT

An acoustic wave element includes a piezoelectric substrate, an IDT electrode including comb electrode fingers, and a reflector including reflective electrode fingers. An average value of all pitches of the comb electrode fingers is smaller than an average value of all pitches of the reflective electrode fingers. When a total number of the comb electrode fingers is defined as N, at least one n-th end-side pitch satisfying $1 \leq n \leq (0.233 \times N)$ is smaller than the average value of all the pitches of the comb electrode fingers.

16 Claims, 15 Drawing Sheets

ACOUSTIC WAVE PROPAGATION DIRECTION

(51) Int. Cl.
   *H03H 9/58*     (2006.01)
   *H03H 9/70*     (2006.01)

(58) Field of Classification Search
   USPC ................................................... 333/193–196
   See application file for complete search history.

(56)                    References Cited

U.S. PATENT DOCUMENTS

| | | | |
|---|---|---|---|
| 2017/0163244 A1* | 6/2017 | Sato | H03H 9/6406 |
| 2019/0305756 A1 | 10/2019 | Urata | |
| 2020/0007110 A1 | 1/2020 | Konaka et al. | |
| 2020/0358424 A1* | 11/2020 | Kaneda | H03H 9/25 |
| 2021/0152153 A1 | 5/2021 | Kishino | |

FOREIGN PATENT DOCUMENTS

| | | |
|---|---|---|
| WO | 2018012367 A1 | 1/2018 |
| WO | 2018168836 A1 | 9/2018 |
| WO | 2019198594 A1 | 10/2019 |

OTHER PUBLICATIONS

Written Opinion in PCT/JP2022/026984, mailed Oct. 11, 2022, 6 pages.

* cited by examiner

| n-TH END-SIDE PITCH | | | | | | | | |
|---|---|---|---|---|---|---|---|---|
| n | 7 | 8 | 9 | 10 | 11 | 12 | 13 | 14 |
| EXAMPLE 10 | 1.0000 | 1.0000 | 1.0000 | 0.9800 | 1.0000 | 1.0000 | 1.0000 | 1.0000 |
| EXAMPLE 11 | 1.0000 | 1.0000 | 0.9933 | 0.9933 | 0.9933 | 1.0000 | 1.0000 | 1.0000 |
| EXAMPLE 12 | 1.0000 | 0.9960 | 0.9960 | 0.9960 | 0.9960 | 0.9960 | 1.0000 | 1.0000 |

FIG. 12
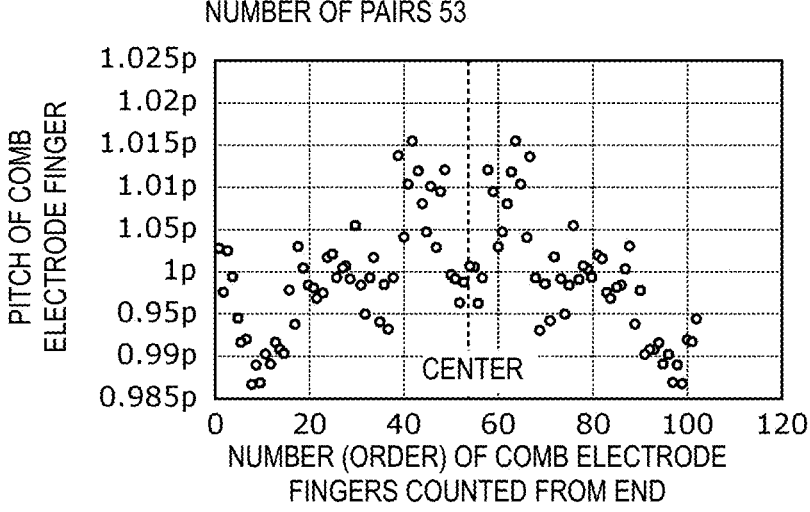
FIG. 13
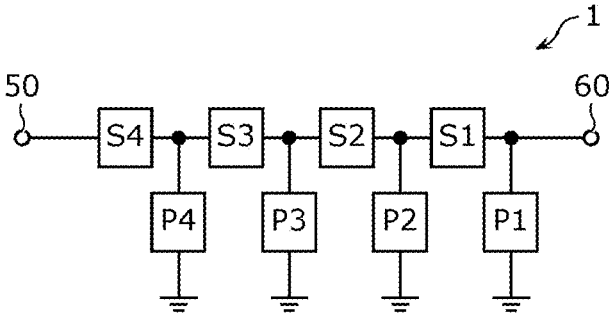
FIG. 14
|  | S4 | P4 | S3 | P3 | S2 | P2 | S1 | P1 |
|---|---|---|---|---|---|---|---|---|
| NUMBER OF PAIRS OF IDTS | 60 | 100 | 120 | 120 | 80 | 120 | 105 | 105 |
| NUMBER OF PAIRS OF REFLECTORS | 10 | 10 | 10 | 10 | 10 | 10 | 10 | 10 |
| INTERSECTION WIDTH | 26.65 | 19.03 | 18.38 | 23.82 | 26.15 | 24.44 | 11.32 | 52.66 |
| IDT WAVELENGTH | 1.969 | 2.042 | 1.962 | 2.039 | 1.979 | 2.033 | 1.969 | 2.078 |
| REFLECTOR WAVELENGTH | 2.047 | 2.049 | 2.041 | 2.032 | 2.058 | 2.117 | 2.048 | 2.082 |
| IDT-REFLECTOR GAP | 0.4 | 0.5 | 0.4 | 0.5 | 0.4 | 0.4 | 0.4 | 0.5 |

FIG. 15A
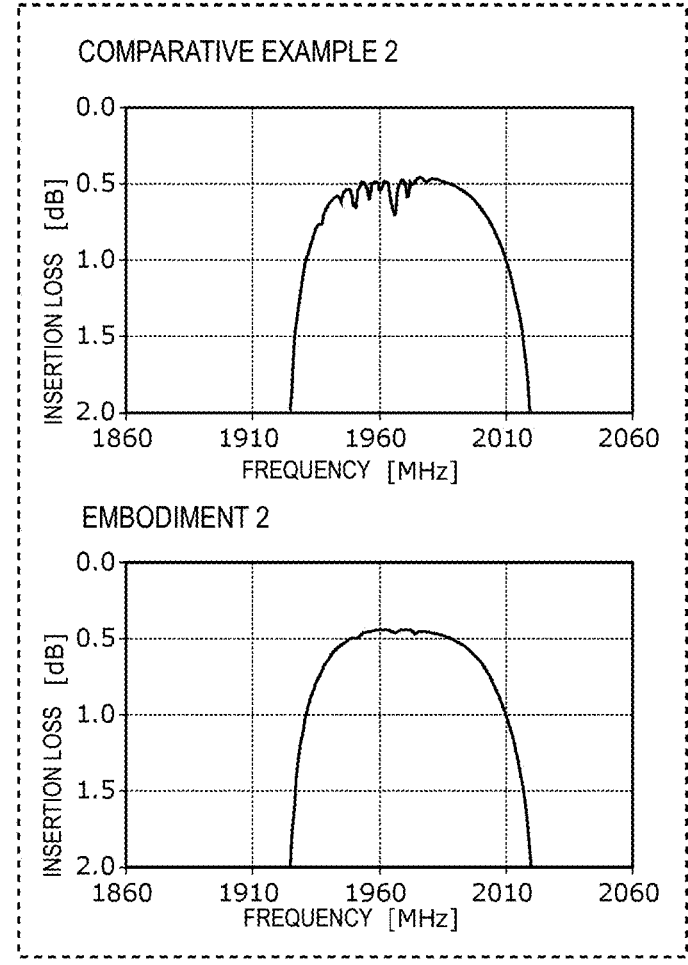
COMPARATIVE EXAMPLE 2
FIG. 15B
EMBODIMENT 2
FIG. 16
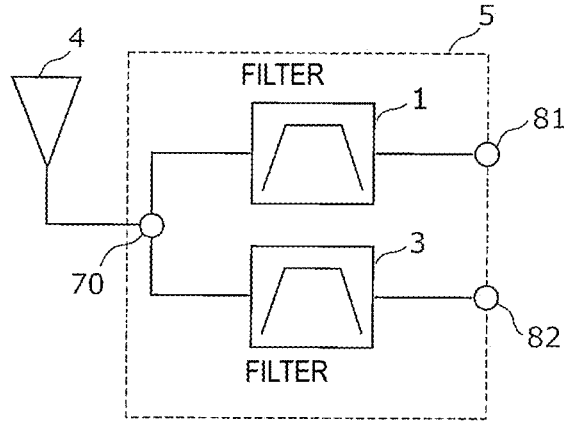

ACOUSTIC WAVE ELEMENT, ACOUSTIC WAVE FILTER DEVICE, AND MULTIPLEXER

CROSS REFERENCE TO RELATED APPLICATIONS

This application claims the benefit of priority to Japanese Patent Application No. 2021-113671 filed on Jul. 8, 2021 and is a Continuation Application of PCT Application No. PCT/JP2022/026984 filed on Jul. 7, 2022. The entire contents of each application are hereby incorporated herein by reference.

BACKGROUND OF THE INVENTION

1. Field of the Invention

The present invention relates to acoustic wave elements, acoustic wave filter devices, and multiplexers.

2. Description of the Related Art

In recent years, a multiband system has been used to improve a data transmission speed of a mobile phone. At this time, since transmission and reception in a plurality of frequency bandwidths may be performed, a plurality of filter devices that pass high-frequency signals in different frequency bandwidths are disposed in a front-end circuit of the mobile phone. In this case, since there is a constraint on mounting space allowed for the front-end circuit, the plurality of filter devices are required to be compact, and to have high isolation from an adjacent band and low-loss characteristics in a pass band.

International Publication No. WO 2018/168836 discloses a configuration of a surface acoustic wave device that improves transmission characteristics. More specifically, the surface acoustic wave device has a circuit configuration including a plurality of surface acoustic wave resonators having interdigital transducer (IDT) electrodes and reflectors. In the circuit configuration described above, an inter-center distance in an acoustic wave propagation direction between an electrode finger of the reflector closest to the IDT electrode and an electrode finger of the IDT electrode closest to the reflector is 0.45 times or less of a wavelength defined by an electrode finger pitch of the reflector electrode. With this configuration, an increase in return loss on the low-frequency side of a resonant frequency of the acoustic wave resonator is prevented.

In the surface acoustic wave resonator described in International Publication No. WO 2018/168836, it is possible to prevent an increase in the return loss on the low-frequency side of the resonant frequency of the acoustic wave resonator. Meanwhile, in some bandwidths on the low-frequency side, the return loss cannot be prevented and a ripple may appear.

SUMMARY OF THE INVENTION

Example embodiments of the present invention provide acoustic wave elements, acoustic wave filter devices, and multiplexers that are each able to reduce or prevent a ripple generated on a low-frequency side of a resonant frequency of an acoustic wave element.

According to an example embodiment of the present invention, an acoustic wave element includes a piezoelectric substrate, an IDT electrode on the piezoelectric substrate and including a pair of comb-shaped electrodes, and a reflector adjacent to the IDT electrode in an acoustic wave propagation direction, wherein each of the comb-shaped electrodes includes a plurality of comb electrode fingers extending in a direction that intersects with the acoustic wave propagation direction, the reflector includes a plurality of reflective electrode fingers extending in the direction that intersects with the acoustic wave propagation direction, when an inter-center distance in the acoustic wave propagation direction between adjacent electrode fingers among the electrode fingers of each of the IDT electrode and the reflector is defined as a pitch, an average value of all pitches of the plurality of comb electrode fingers is smaller than an average value of all pitches of the plurality of reflective electrode fingers, and when a total number of the plurality of comb electrode fingers is defined as N, the comb electrode finger closest to the reflector among the plurality of comb electrode fingers is defined as a first end-side electrode finger, electrode fingers in a direction from the first end-side electrode finger toward a center of the IDT electrode are sequentially defined as an n-th end-side electrode finger where n is a natural number, and a pitch between the n-th end-side electrode finger and an (n+1)-th end-side electrode finger is defined as an n-th end-side pitch, at least one n-th end-side pitch satisfying Formula 1A below is smaller than the average value of all the pitches of the plurality of comb electrode fingers $$1 \leq n \leq (0.233 \times N) \qquad \text{(Formula 1A)}.$$

According to an example embodiment of the present invention, an acoustic wave element includes a piezoelectric substrate, an IDT electrode on the piezoelectric substrate and including a pair of comb-shaped electrodes, and a reflector adjacent to the IDT electrode in an acoustic wave propagation direction, wherein each of the comb-shaped electrodes includes a plurality of comb electrode fingers extending in a direction that intersects with the acoustic wave propagation direction, the reflector includes a plurality of reflective electrode fingers extending in the direction that intersects with the acoustic wave propagation direction, when an inter-center distance in the acoustic wave propagation direction between adjacent electrode fingers among the electrode fingers of each of the IDT electrode and the reflector is defined as a pitch, an average value of all pitches of the plurality of comb electrode fingers is smaller than an average value of all pitches of the plurality of reflective electrode fingers, and when a total number of the plurality of comb electrode fingers is defined as N, the comb electrode finger closest to the reflector among the plurality of comb electrode fingers is defined as a first end-side electrode finger, electrode fingers in a direction from the first end-side electrode finger toward a center of the IDT electrode are sequentially defined as an n-th end-side electrode finger where n is a natural number, in a case where N is an odd number, an (N/2−0.5)-th end-side electrode finger is defined as a first inner-side electrode finger and in a case where N is an even number, an (N/2)-th end-side electrode finger is defined as the first inner-side electrode finger, electrode fingers in a direction from the first inner-side electrode finger toward the reflector are sequentially defined as an m-th inner-side electrode finger (m is a natural number), and a pitch between the m-th inner-side electrode finger and an (m−1)-th inner-side electrode finger is defined as an m-th inner-side pitch, at least one m-th inner-side pitch satisfying Formula 2A below is larger than the average value of all the pitches of the plurality of comb electrode fingers $$1 \leq m \leq (0.167 \times N) \qquad \text{(Formula 2A)}.$$

According to an example embodiment of the present invention, an acoustic wave filter device includes an acoustic wave element according to an example embodiment of the present invention.

According to an example embodiment of the present invention, a multiplexer includes a plurality of filters including an acoustic wave filter device according to an example embodiment of the present invention, wherein one of an input terminal and an output terminal of each of the plurality of filters is directly or indirectly connected to a common terminal, and at least one of the plurality of filters, except for the acoustic wave filter device, has a pass band higher than a frequency of a pass band of the acoustic wave filter device.

According to an example embodiment of the present invention, an acoustic wave element includes a piezoelectric substrate, an IDT electrode on the piezoelectric substrate and including a pair of comb-shaped electrodes, and a reflector adjacent to the IDT electrode, wherein each of the comb-shaped electrodes includes a plurality of comb electrode fingers extending in a first direction, the reflector includes a plurality of reflective electrode fingers extending in the first direction, and located adjacent to the IDT electrode in a second direction that intersects with the first direction, when an inter-center distance between adjacent electrode fingers in the second direction among the electrode fingers of each of the IDT electrode and the reflector is set as a pitch, an average value of all pitches of the plurality of comb electrode fingers is smaller than an average value of all pitches of the plurality of reflective electrode fingers, and when a total number of the plurality of comb electrode fingers is set as N, the comb electrode finger closest to the reflector among the plurality of comb electrode fingers is set as a first end-side electrode finger, electrode fingers in a direction from the first end-side electrode finger toward a center of the IDT electrode are sequentially set as an n-th end-side electrode finger where n is a natural number, and a pitch between the n-th end-side electrode finger and an (n+1)-th end-side electrode finger is set as an n-th end-side pitch, at least one n-th end-side pitch satisfying (Formula 1A) is smaller than the average value of all the pitches of the plurality of comb electrode fingers $$1 \leq n \leq (0.233 \times N) \qquad \text{(Formula 1A)}.$$

According to an example embodiment of the present invention, an acoustic wave element includes a piezoelectric substrate, an IDT electrode on the piezoelectric substrate and including a pair of comb-shaped electrodes, and a reflector adjacent to the IDT electrode, wherein each of the comb-shaped electrodes includes a plurality of comb electrode fingers extending in a first direction, the reflector includes a plurality of reflective electrode fingers extending in the first direction, and located adjacent to the IDT electrode in a second direction that intersects with the first direction, when an inter-center distance between adjacent electrode fingers in the second direction among the electrode fingers of each of the IDT electrode and the reflector is set as a pitch, an average value of all pitches of the plurality of comb electrode fingers is smaller than an average value of all pitches of the plurality of reflective electrode fingers, and when a total number of the plurality of comb electrode fingers is set as N, the comb electrode finger closest to the reflector among the plurality of comb electrode fingers is set as a first end-side electrode finger, electrode fingers in a direction from the first end-side electrode finger toward a center of the IDT electrode are sequentially set as an n-th end-side electrode finger where n is a natural number, in a case where N is an odd number, an (N/2−0.5)-th end-side electrode finger is set as a first inner-side electrode finger and in a case where N is an even number, an (N/2)-th end-side electrode finger is set as the first inner-side electrode finger, electrode fingers in a direction from the first inner-side electrode finger toward the reflector are sequentially set as an m-th inner-side electrode finger (m is a natural number), and a pitch between the m-th inner-side electrode finger and an (m−1)-th inner-side electrode finger is set as an m-th inner-side pitch, at least one m-th inner-side pitch satisfying (Formula 2A) is larger than the average value of all the pitches of the plurality of comb electrode fingers $$1 \leq m \leq (0.167 \times N) \qquad \text{(Formula 2A)}.$$

With acoustic wave elements, acoustic wave filter devices, and multiplexers according to example embodiments of the present invention, it is possible to reduce or prevent a ripple generated on a low-frequency side of a resonant frequency of an acoustic wave element.

The above and other elements, features, steps, characteristics and advantages of the present invention will become more apparent from the following detailed description of the example embodiments with reference to the attached drawings.

BRIEF DESCRIPTION OF THE DRAWINGS

FIG. 12 is a diagram illustrating another example of the pitch of the comb electrode finger of the IDT electrode and a pitch of a reflective electrode finger of a reflector.

FIG. 13 is a diagram illustrating a circuit configuration of an acoustic wave filter device according to Example Embodiment 2 of the present invention.

FIG. 14 is a diagram illustrating an electrode parameter of an acoustic wave element of the acoustic wave filter device according to Example Embodiment 2 of the present invention.

FIGS. 15A and 15B are graphs comparing bandpass characteristics of acoustic wave filter devices according to Example Embodiment 2 and Comparative Example 2.

FIG. 16 is a circuit configuration diagram of a multiplexer according to Example Embodiment 3 of the present invention and a peripheral circuit of the multiplexer.

DETAILED DESCRIPTION OF THE EXAMPLE EMBODIMENTS

Figure 1:
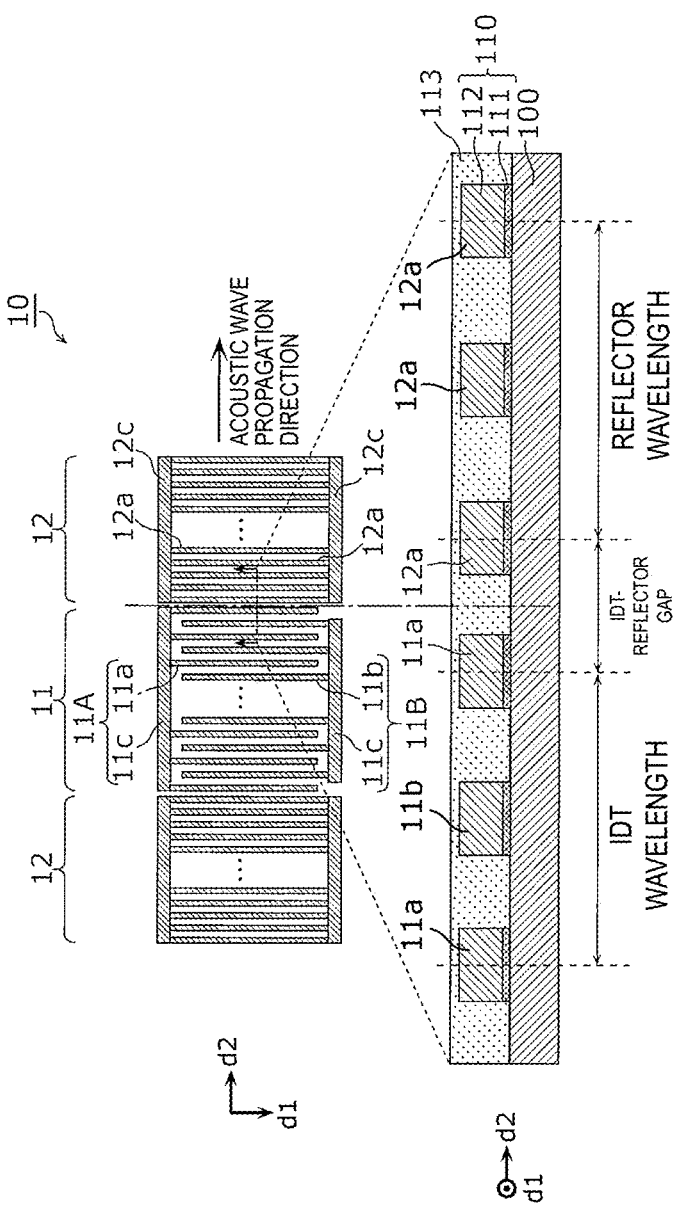
FIG. 1 is a plan view and a cross-sectional diagram schematically illustrating an electrode configuration of an acoustic wave element according to Example Embodiment 1 of the present invention.

Hereinafter, example embodiments of the present invention will be described in detail with reference to the drawings and tables. Examples to be described below are all comprehensive or specific examples. A numerical value, a shape, a material, a component, arrangement of components, a connection form, and the like illustrated in the following examples are examples, and example embodiments of the present invention are not limited thereto. Among the components in the following examples, a component that is not described in an independent claim is described as an optional component. In addition, a size or a size ratio of the component illustrated in the drawings is not necessarily strict.

Example Embodiment 1

1. 1 Configuration of Acoustic Wave Element

A configuration of an acoustic wave element 10 according to the present example embodiment will be described.

FIG. 1 is a plan view and a cross-sectional diagram schematically illustrating an electrode configuration of an acoustic wave element 10 according to Example Embodiment 1. The acoustic wave element 10 illustrated in FIG. 1 includes an interdigital transducer (IDT) electrode 11 and a reflector 12, which include a piezoelectric substrate 100, an electrode 110, and a protective film 113 and defined by these components. The acoustic wave element 10 according to the present example embodiment is, for example, a surface acoustic wave (SAW) resonator including the IDT electrode 11, the reflector 12, and the piezoelectric substrate 100.

The acoustic wave element 10 illustrated in FIG. 1 is for describing a typical structure thereof, and the number, length, and the like of electrode fingers of an electrode are not limited thereto.

The electrode 110 of the IDT electrode 11 and the reflector 12 has a stack structure including a close contact layer 111 and a main electrode layer 112, as illustrated in the cross-sectional diagram in FIG. 1.

The close contact layer 111 improves the adhesion between the piezoelectric substrate 100 and the main electrode layer 112, and as a material, for example, Ti may be used.

As a material of the main electrode layer 112, for example, Al including Cu in an amount of about 1% may be used.

The protective film 113 covers the electrode 110. The protective film 113 protects the main electrode layer 112 from an outside environment, adjusts frequency temperature characteristics, increases moisture resistance, or the like, and is, for example, a film of which a main component is silicon dioxide ($SiO_2$).

The materials of the close contact layer 111, the main electrode layer 112, and the protective film 113 are not limited to the materials described above. Further, the electrode 110 may have another structure other than the stack structure described above. The electrode 110 may be made of, for example, a metal such as Ti, Al, Cu, Pt, Au, Ag, and Pd, or an alloy of such a metal, or may include a plurality of multilayer bodies made of the metals or alloys described above. Further, the protective film 113 is not formed, in some cases.

The piezoelectric substrate 100 is made of, for example, a $\theta^\circ$ Y-cut X propagation $LiNbO_3$ piezoelectric single crystal or piezoelectric ceramics (a lithium niobate single crystal or ceramics cut by a plane with an axis, as a normal line, rotated by $\theta^\circ$ from a Y-axis in a Z-axis direction with an X-axis as a central axis, which is a single crystal or ceramics through which surface acoustic waves propagate in an X-axis direction).

The piezoelectric substrate 100 may be a substrate including a piezoelectric body layer in at least one portion, or may have a stack structure including the piezoelectric body layer.

The piezoelectric substrate 100 includes, for example, a high velocity support substrate, a low velocity film, and a piezoelectric body layer, and may have a structure in which the high velocity support substrate, the low velocity film, and the piezoelectric body layer are stacked in this order. Hereinafter, configurations of the high velocity support substrate, the low velocity film, and the piezoelectric body layer will be described.

The piezoelectric body layer is made of, for example, a $\theta°$ Y-cut X propagation LiNbO$_3$ piezoelectric single crystal or piezoelectric ceramics (a lithium niobate single crystal or ceramics cut by a plane with an axis, as a normal line, rotated by $\theta°$ from the Y-axis in the Z-axis direction with an X-axis as a central axis, which is a single crystal or ceramics through which surface acoustic waves propagate in an X-axis direction).

The high velocity support substrate supports the low velocity film, the piezoelectric body layer, and the electrode 110. Further, the high velocity support substrate is a substrate in which a bulk wave in the high velocity support substrate has a higher acoustic velocity than an acoustic wave of a surface wave or a boundary wave propagating through the piezoelectric body layer, and defines and functions to confine a surface acoustic wave in a portion at which the piezoelectric body layer and the low velocity film are stacked, and prevent the surface acoustic wave from leaking below the high velocity support substrate. The high velocity support substrate is, for example, a silicon substrate. The high velocity support substrate may be made of, for example, any of (1) a piezoelectric body such as aluminum nitride, aluminum oxide, silicon carbide, silicon nitride, silicon, sapphire, lithium tantalate, lithium niobate, or crystal quartz, (2) various ceramics such as alumina, zirconia, cordierite, mullite, steatite, or forsterite, (3) magnesia diamond, (4) a material having each of the above materials as a main component, and (5) a material having a mixture of each of the above materials as a main component.

The low velocity film is a film in which an acoustic velocity of a bulk wave in the low velocity film is lower than an acoustic velocity of an acoustic wave propagating through the piezoelectric body layer, and is disposed between the piezoelectric body layer and the high velocity support substrate. By the structure and the property that the energy of the acoustic wave is essentially concentrated on a medium having a low velocity, the leak of the surface acoustic wave energy to the outside of the IDT electrode is prevented. The low velocity film is, for example, a film having silicon dioxide (SiO$_2$) as a main component.

With the stack structure of the piezoelectric substrate 100, a Q factor of the acoustic wave resonator at a resonant frequency and an anti-resonant frequency can be significantly increased, as compared with a structure in which the piezoelectric substrate 100 is used as a single layer. That is, since a surface acoustic wave resonator having a high Q factor can be configured, a filter having a small insertion loss can be configured by using the surface acoustic wave resonator.

The high velocity support substrate may have a structure in which a support substrate and a high velocity film in which a bulk wave propagating therethrough has an acoustic velocity higher than an acoustic wave of a surface wave or a boundary wave propagating through the piezoelectric body layer are stacked. In this case, as the support substrate, a piezoelectric body such as sapphire, lithium tantalate, lithium niobate, or crystal quartz, various ceramics such as alumina, magnesia, silicon nitride, aluminum nitride, silicon carbide, zirconia, cordierite, mullite, steatite, forsterite, a dielectric body such as glass or a semiconductor such as silicon and gallium nitride, a resin substrate, and the like can be used. In addition, as the high velocity film, various high velocity materials, such as, for example, aluminum nitride, aluminum oxide, silicon carbide, silicon nitride, silicon oxynitride, a DLC film or diamond, a medium having the above material as a main component, a medium having a mixture of the above materials as a main component, and the like can be used.

The material or the like of each layer illustrated in the above stack structure of the piezoelectric substrate 100 is an example, and may be changed according to, for example, characteristics to be emphasized among required high-frequency propagation characteristics.

As illustrated in plan view in FIG. 1, the IDT electrode 11 includes a pair of comb-shaped electrodes 11A and 11B that face each other. The comb-shaped electrode 11A includes a plurality of comb electrode fingers 11a extending in a direction that intersects with an acoustic wave propagation direction, and a busbar electrode 11c that connects one end of each of the plurality of comb electrode fingers 11a. The comb-shaped electrode 11B includes a plurality of comb electrode fingers 11b extending in the direction that intersects with the acoustic wave propagation direction, and the busbar electrode 11c that connects one end of each of the plurality of comb electrode fingers 11b. Each electrode finger of the plurality of comb electrode fingers 11a and 11b are alternately arranged in the acoustic wave propagation direction. In a case where the comb electrode fingers 11a and 11b extend in parallel or substantially in parallel as in the present example embodiment, the acoustic wave propagation direction and a direction in which the comb electrode fingers 11a and 11b extend are orthogonal or substantially orthogonal to each other. In other words, in a case where the direction in which the comb electrode fingers 11a and 11b extend is set as a first direction d1, a second direction d2 orthogonal to the first direction d1 on the piezoelectric substrate 100 is the same direction as the acoustic wave propagation direction.

The reflector 12 is disposed adjacent to the IDT electrode 11 in the acoustic wave propagation direction. The reflector 12 includes a plurality of reflective electrode fingers 12a extending in the direction that intersects with the acoustic wave propagation direction, and a busbar electrode 12c that connects one end of each of the plurality of reflective electrode fingers 12a. In a case where each of the reflective electrode fingers 12a extends in parallel or substantially in parallel as in the present example embodiment, the acoustic wave propagation direction and a direction in which the reflective electrode fingers 12a extend are orthogonal or substantially orthogonal to each other. The direction in which the reflective electrode finger 12a extends is the same or substantially the same as the first direction d1 described above.

In the acoustic wave element 10 of the present example embodiment, an average value of all pitches of the plurality of comb electrode fingers 11a and 11b of the IDT electrode 11 is smaller than an average value of all pitches of the plurality of reflective electrode fingers 12a of the reflector 12.

The pitch is an inter-center distance in the acoustic wave propagation direction between adjacent electrode fingers, among the respective electrode fingers of the IDT electrode 11 and the reflector 12. The average value of all the pitches of the plurality of comb electrode fingers 11a and 11b is obtained, for example, by dividing a distance between both ends of the plurality of comb electrode fingers 11a and 11b by (the total number of the plurality of comb electrode fingers 11*a* and 11*b*−1). Further, the average value of all the pitches of the plurality of reflective electrode fingers 12*a* is obtained, for example, by dividing a distance between both ends of the plurality of reflective electrode fingers 12*a* by (the total number of the plurality of reflective electrode fingers 12*a*−1). Twice the average value of all the pitches of the plurality of comb electrode fingers 11*a* and 11*b* corresponds to an IDT wavelength. Twice the average value of all the pitches of the plurality of reflective electrode fingers 12*a* corresponds to a reflector wavelength.

Further, the acoustic wave element 10 according to the present example embodiment has a configuration as described below.

Figure 2A:
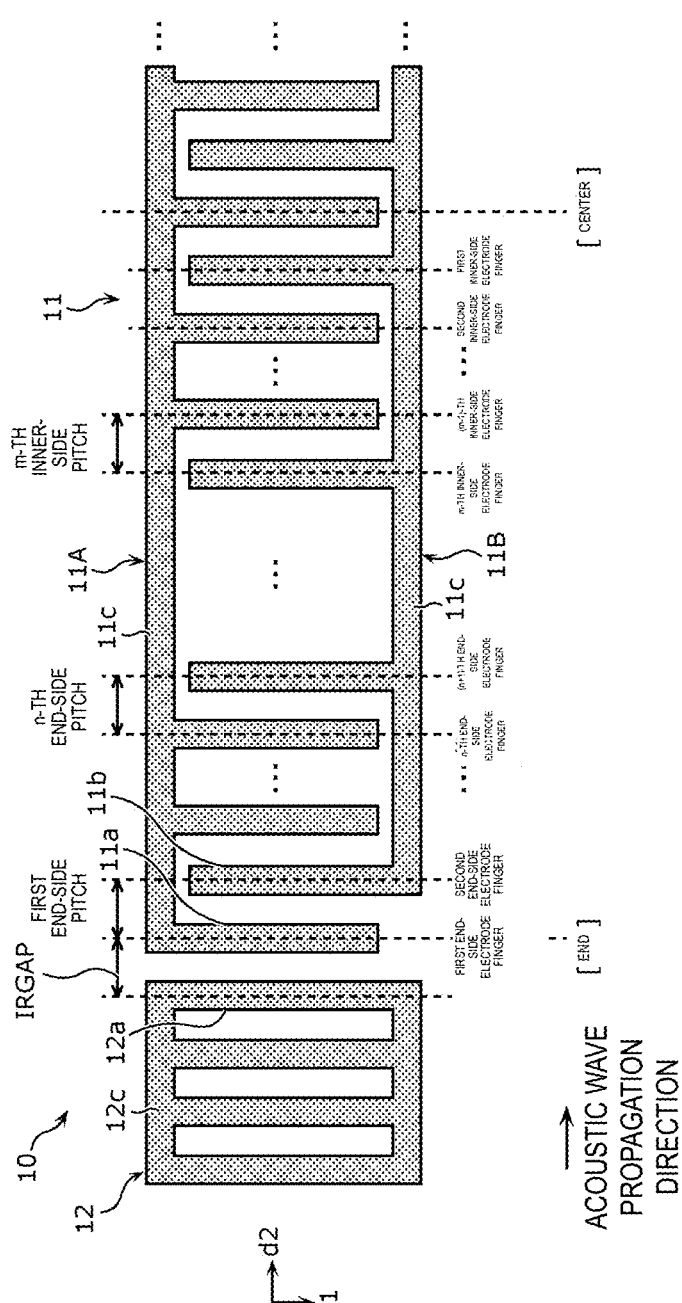
FIG. 2A is a diagram illustrating an electrode configuration in a case where the total number of comb electrode fingers of an IDT electrode of the acoustic wave element is an odd number.
Figure 2B:
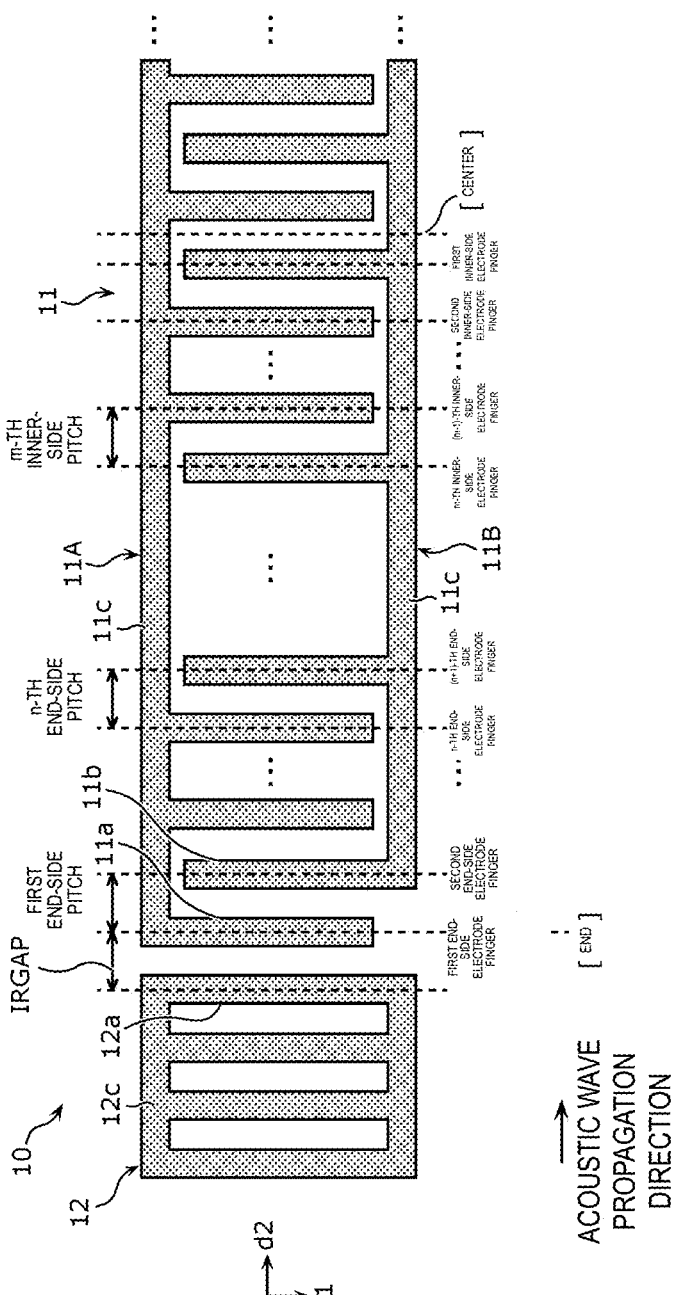
FIG. 2B is a diagram illustrating an electrode configuration in a case where the total number of comb electrode fingers of the IDT electrode of the acoustic wave element is an even number.

FIG. 2A is a diagram illustrating an electrode configuration in a case where the total number of comb electrode fingers 11*a* and 11*b* of the IDT electrode 11 is an odd number. FIG. 2B is a diagram illustrating an electrode configuration in a case where the total number of comb electrode fingers 11*a* and 11*b* of the IDT electrode 11 is an even number.

For example, the plurality of comb electrode fingers 11*a* and 11*b* of the IDT electrode 11 are arranged left-right symmetrically in the acoustic wave propagation direction.

Here, the total number of the plurality of comb electrode fingers 11*a* and 11*b* illustrated in FIGS. 2A and 2B is set as N. In addition, a comb electrode finger closest to one reflector 12, among the plurality of comb electrode fingers 11*a* and 11*b*, is defined as a first end-side electrode finger. Electrode fingers in a direction from the first end-side electrode finger to the other reflector 12 are sequentially defined as an n-th end-side electrode finger (n is a natural number). A pitch between the n-th end-side electrode finger and an (n+1)-th end-side electrode finger is defined as an n-th end-side pitch. In a case where the total number N of the plurality of comb electrode fingers 11*a* and 11*b* is an odd number, a position of a center of an (N/2+0.5)-th end-side electrode finger in the acoustic wave propagation direction is set as a center of the IDT electrode. In a case where the total number N of the plurality of comb electrode fingers 11*a* and 11*b* is an even number, a position of a center of an (N/2)-th end electrode finger and an (N/2+1)-th end electrode finger in the acoustic wave propagation direction is set as the center of the IDT electrode.

Under the above definition, the acoustic wave element 10 of the present example embodiment has a configuration in which $$1 \leq n \leq (0.233 \times N) \qquad \text{(Formula 1A)}$$

At least one n-th end-side pitch satisfying (Formula 1A) is smaller than an average value of all the pitches of the plurality of comb electrode fingers 11*a* and 11*b*. With this configuration, it is possible to reduce or prevent a ripple generated on a low-frequency side of a resonant frequency of the acoustic wave element 10. This point will be described below.

Further, as illustrated in FIG. 2A, in a case where the total number N is an odd number, an (N/2−0.5)-th end-side electrode finger is defined as a first inner-side electrode finger, or as illustrated in FIG. 2B, in a case where the total number N is an even number, the (N/2)-th end-side electrode finger is defined as the first inner-side electrode finger. Electrode fingers in a direction from the first inner-side electrode finger to the reflector 12 are sequentially defined as an m-th inner-side electrode finger (m is a natural number).

A pitch between the m-th inner-side electrode finger and the (m−1)-th inner-side electrode finger is defined as an m-th inner-side pitch.

Under the above definition, the acoustic wave element 10 of the present example embodiment has a configuration in which $$1 \leq m \leq (0.167 \times N) \qquad \text{(Formula 2A)}$$

At least one m-th inner-side pitch satisfying (Formula 2A) is larger than the average value of all the pitches of the plurality of comb electrode fingers 11*a* and 11*b*. With this configuration, it is possible to reduce or prevent a ripple generated on a low-frequency side of a resonant frequency of the acoustic wave element 10. This point will also be described below.

Further, the acoustic wave element 10 may have a configuration to be described below.

For example, in the acoustic wave element 10, an IDT-reflector gap (IRGAP) illustrated in FIG. 1 may be, for example, about 0.9 times or less of the average value of all the pitches of the plurality of reflective electrode fingers (for example, about 0.45 times or less of the reflector wavelength). Further, the average value of all the pitches of the plurality of comb electrode fingers may be smaller than the average value of all the pitches of the plurality of reflective electrode fingers. The IDT-reflector gap is a distance between centers (inter-center distance) in the acoustic wave propagation direction of the comb electrode finger 11*a* closest to the reflector 12 among the plurality of comb electrode fingers 11*a* and 11*b* and the reflective electrode finger 12*a* closest to the IDT electrode 11 among the plurality of reflective electrode fingers 12*a*.

With these configurations, a return loss on the low-frequency side of the resonant frequency of the acoustic wave element 10 can be further reduced.

Hereinafter, the configuration and advantageous effects of the acoustic wave element 10 according to the present example embodiment will be described while comparing a comparative example and an examples.

1. 2 Examples 1A, 1B, and 1C and Examples 2A, 2B, and 2C

First, Examples 1A to 1C will be described with reference to FIGS. 3A to 3C and FIGS. 4A to 4C. In Examples 1A to 1C, an example in which a pitch of two comb electrode fingers adjacent to each other at a predetermined position in a direction from an end toward a center of the IDT electrode 11 is set to be smaller than an average value of all pitches of the plurality of comb electrode fingers 11*a* and 11*b* will be described. Hereinafter, the average value of all the pitches of the plurality of comb electrode fingers 11*a* and 11*b* is referred to as an average pitch, in some cases.

Example 1A

Figure 3A:
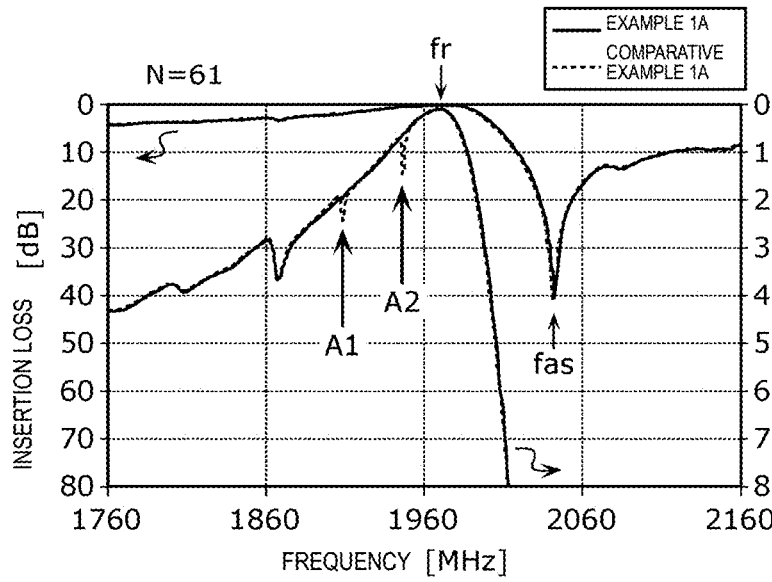
FIG. 3A is a diagram illustrating insertion losses of acoustic wave elements of Comparative Example 1A and Example 1A (in a case where the total number of comb electrode fingers is 61).

FIG. 3A is a diagram illustrating insertion losses of acoustic wave elements according to Comparative Example 1A and Example 1A (in a case where the total number of comb electrode fingers is 61). FIG. 3A illustrates that the return loss is increased as approaching a lower side of a vertical axis.

In each of Comparative Example 1A and Example 1A, the number of pairs of IDT electrodes 11 is 30, and the total number N of the comb electrode fingers 11*a* and 11*b* is 61.

Comparative Example 1A is an example in which the pitches of the plurality of comb electrode fingers 11*a* and 11*b* of the IDT electrode 11 are all the same.

Example 1A is an example in which a pitch of two comb electrode fingers adjacent to each other at a predetermined position in a direction from an end toward a center of the IDT electrode 11 is smaller than the average pitch. Specifically, in Example 1A, the pitch of the two comb electrode fingers is set to, for example, about 0.98 times the average pitch.

As illustrated in FIG. 3A, in Comparative Example 1A, ripples A1 and A2 are generated on a low-frequency side of a resonant frequency fr of an acoustic wave element. In contrast, in Example 1A, the generation of each of the ripples A1 and A2 is prevented. In this manner, by making the pitch of the two comb electrode fingers adjacent to each other at the predetermined position spaced away from the end smaller than the average pitch, it is possible to reduce the ripple generated on the low-frequency side than the resonant frequency fr of the acoustic wave element 10.

It is preferable that the pitch of the two comb electrode fingers is the smallest in all the pitches configured with all the comb electrode fingers 11*a* and 11*b*.

The ripple that appears near the resonant frequency of the acoustic wave resonator becomes a ripple at a center of a pass band when the acoustic wave resonator is used for a series arm. Since the ripple effects a power withstand or GDT, it is preferable that the ripple is small. Therefore, in the present example embodiment, evaluation is performed by focusing on the ripple close to the resonant frequency. The same manner is applied to the following.

Figure 4A:
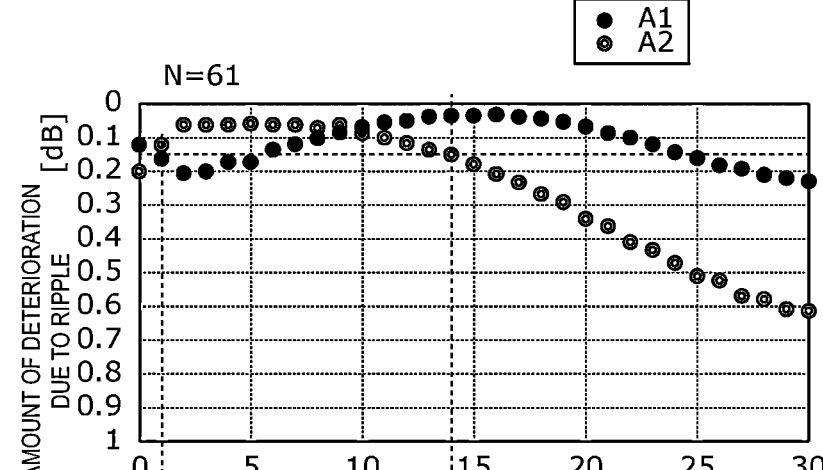
FIG. 4A is a diagram illustrating the amount of deterioration due to a ripple in a case where a position of a pitch of two comb electrode fingers smaller than an average pitch is changed (in a case where the total number of comb electrode fingers is 61).

FIG. 4A is a diagram illustrating the amount of deterioration due to a ripple in a case where a position of a pitch of two comb electrode fingers smaller than an average pitch is changed (in a case where the total number of comb electrode fingers is 61). The amount of deterioration due to the ripple is the amount of loss when the ripple is generated, by using a state in which the ripple is not generated as a reference.

FIG. 4A illustrates an example in which n of an n-th end-side pitch, which is a pitch between the n-th end-side electrode finger and the (n+1)-th end-side electrode finger is changed from 1 to 30 in order, as an example in which the position of the pitch of the two comb electrode fingers is sequentially changed. The pitch of the two comb electrode fingers is, for example, about 0.98 times the average pitch. In FIG. 4A, n=0 on a horizontal axis indicates a case where the pitch of the two comb electrode fingers is not changed. The n-th end-side electrode finger has a relationship of n<(N/2−m) not to be located on a central side of the m-th inner-side electrode finger described above.

FIG. 4A illustrates a position of the n-th end-side pitch when the center side is viewed from one end of the IDT electrode 11, and in the present example, the same or substantially the same configuration is also applied to the n-th end-side pitch when the center side is viewed from the other end. That is, the acoustic wave element 10 has two n-th end-side pitches, and the two n-th end-side pitches are located to be line-symmetric with respect to a center line passing through the center of the IDT electrode 11 in the acoustic wave propagation direction.

As illustrated in FIG. 4A, the amount of deterioration due to each of the ripples A1 and A2 is changed by changing the position of the pitch of the two comb electrode fingers smaller than the average pitch. Therefore, by setting the position of the pitch of the two comb electrode fingers smaller than the average pitch in a predetermined range, the amount of deterioration due to each of the ripples A1 and A2 can be reduced.

For example, by setting n of the n-th end-side pitch in a range of 1≤n≤14, the amount of deterioration due to each of the ripples A1 and A2 can be improved more than monitoring (n=0) which is Comparative Example 1A. When an upper limit value of n of the n-th end-side pitch is represented by using the total number N of the plurality of comb electrode fingers 11*a* and 11*b*, 14/61=about 0.233. Therefore, in the acoustic wave element 10, by setting the position of the n-th end-side pitch, which is smaller than the average pitch, in a range illustrated in (Formula 1A) below, the amount of deterioration caused by each of the ripples A1 and A2 can be improved than the monitoring (n=0).

$$1 \leq n \leq (0.233 \times N) \qquad \text{(Formula 1A)}$$

Example 1B

Figure 3B:
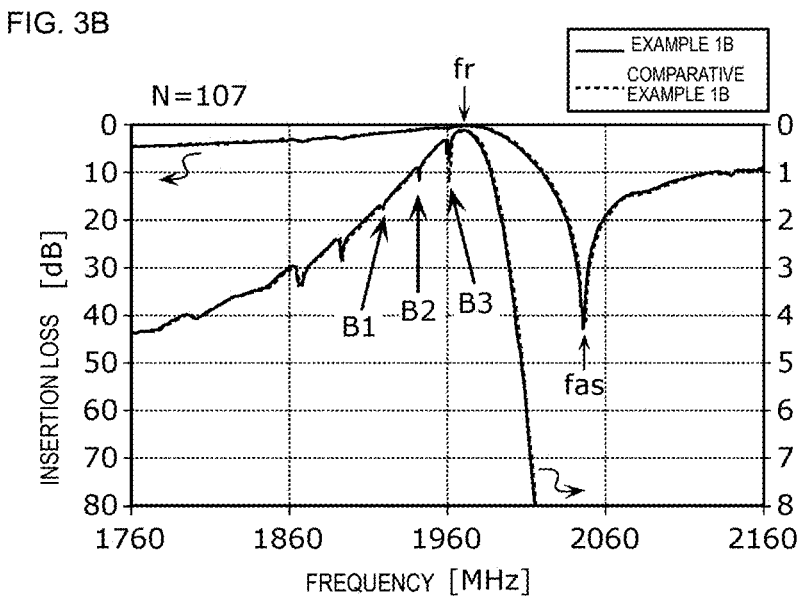
FIG. 3B is a diagram illustrating insertion losses of acoustic wave elements of Comparative Example 1B and Example 1B (in a case where the total number of comb electrode fingers is 107).

FIG. 3B is a diagram illustrating insertion losses of acoustic wave elements of Comparative Example 1B and Example 1B (in a case where the total number of comb electrode fingers is 107). FIG. 3B illustrates that the return loss is increased as approaching a lower side of a vertical axis.

In each of Comparative Example 1B and Example 1B, the number of pairs of IDT electrodes 11 is 53, and the total number N of comb electrode fingers 11*a* and 11*b* is 107.

Comparative Example 1B is an example in which pitches of the plurality of comb electrode fingers 11*a* and 11*b* of the IDT electrode 11 are all the same or substantially the same.

Example 1B is an example in which a pitch of two comb electrode fingers adjacent to each other at a predetermined position in a direction from an end toward a center of the IDT electrode 11 is smaller than the average pitch. Specifically, in Example 1B, the pitch of the two comb electrode fingers is set to, for example, about 0.98 times the average pitch.

As illustrated in FIG. 3B, in Comparative Example 1B, ripples B1, B2, and B3 are generated on a low-frequency side of the resonant frequency fr of the acoustic wave element. In contrast, in Example 1B, the generation of each of the ripples B1, B2, and B3 is prevented. In this manner, by making the pitch of the two comb electrode fingers adjacent to each other at the predetermined position spaced away from the end smaller than the average pitch, it is possible to reduce the ripple generated on the low-frequency side than the resonant frequency fr of the acoustic wave element 10.

It is preferable that the pitch of the two comb electrode fingers is the smallest in all the pitches configured with all the comb electrode fingers 11*a* and 11*b*.

Figure 4B:
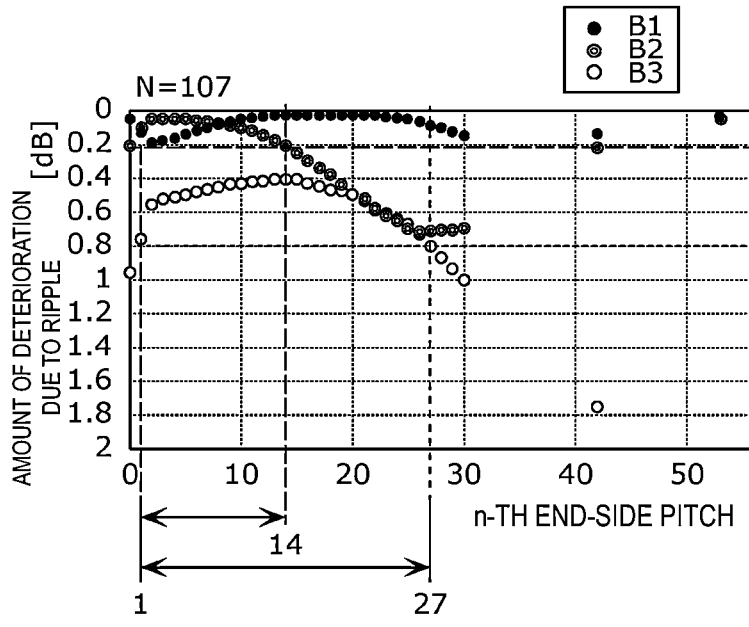
FIG. 4B is a diagram illustrating the amount of deterioration due to a ripple in a case where a position of a pitch of two comb electrode fingers smaller than an average pitch is changed (in a case where the total number of comb electrode fingers is 107).

FIG. 4B is a diagram illustrating the amount of deterioration due to a ripple in a case where a position of a pitch of two comb electrode fingers smaller than an average pitch is changed (in a case where the total number of comb electrode fingers is 107).

FIG. 4B illustrates an example in which n of an n-th end-side pitch, which is a pitch between the n-th end-side electrode finger and the (n+1)-th end-side electrode finger is changed from 1 to 53 in order, as an example in which the position of the pitch of the two comb electrode fingers is sequentially changed. The pitch of the two comb electrode fingers is, for example, about 0.98 times the average pitch. In FIG. 4B, n=0 on a horizontal axis indicates a case where the pitch of the two comb electrode fingers is not changed.

The n-th end-side electrode finger has a relationship of n<(N/2−m) not to be located on a central side of the m-th inner-side electrode finger described above.

FIG. 4B illustrates a position of the n-th end-side pitch when the center side is viewed from one end of the IDT electrode 11, and in the present example, the same or substantially the same configuration is also applied to the n-th end-side pitch when the center side is viewed from the other end. That is, the acoustic wave element 10 has two n-th end-side pitches, and the two n-th end-side pitches are located to be line-symmetric with respect to a center line passing through the center of the IDT electrode 11 in the acoustic wave propagation direction.

As illustrated in FIG. 4B, the amount of deterioration due to each of the ripples B1, B2, and B3 is changed by changing the position of the pitch of the two comb electrode fingers smaller than the average pitch. Therefore, by setting the position of the pitch of the two comb electrode fingers smaller than the average pitch in a predetermined range, the amount of deterioration due to each of the ripples B1, B2, and B3 can be reduced.

For example, by setting n of the n-th end-side pitch in a range of $1 \leq n \leq 27$, the amount of deterioration due to each of the ripples B1, B2, and B3 can be improved more than the monitoring (n=0) which is Comparative Example 1B. When an upper limit value of n of the n-th end-side pitch is represented by using the total number N of the plurality of comb electrode fingers 11a and 11b, 27/107=0.255. Therefore, in the acoustic wave element 10, by setting the position of the n-th end-side pitch, which is smaller than the average pitch, in a range illustrated in (Formula 1B) below, the amount of deterioration caused by each of the ripples B1, B2, and B3 can be improved than the monitoring (n=0).

$$1 \leq n \leq (0.255 \times N) \qquad \text{(Formula 1B)}$$

Further, for example, by setting n of the n-th end-side pitch in a range of $1 \leq n \leq 14$, the amount of deterioration due to each of the ripples B1, B2, and B3 can be further improved than the monitoring (n=0). When an upper limit value of n of the n-th end-side pitch is represented by using the total number N of the plurality of comb electrode fingers 11a and 11b, 14/107=0.132. Therefore, in the acoustic wave element 10, by setting the position of the n-th end-side pitch, which is smaller than the average pitch, in a range illustrated in (Formula 3B) below, the amount of deterioration caused by each of the ripples B1, B2, and B3 can be further improved than the monitoring (n=0).

$$1 \leq n \leq (0.132 \times N) \qquad \text{(Formula 3B)}$$

Example 1C

Figure 3C:
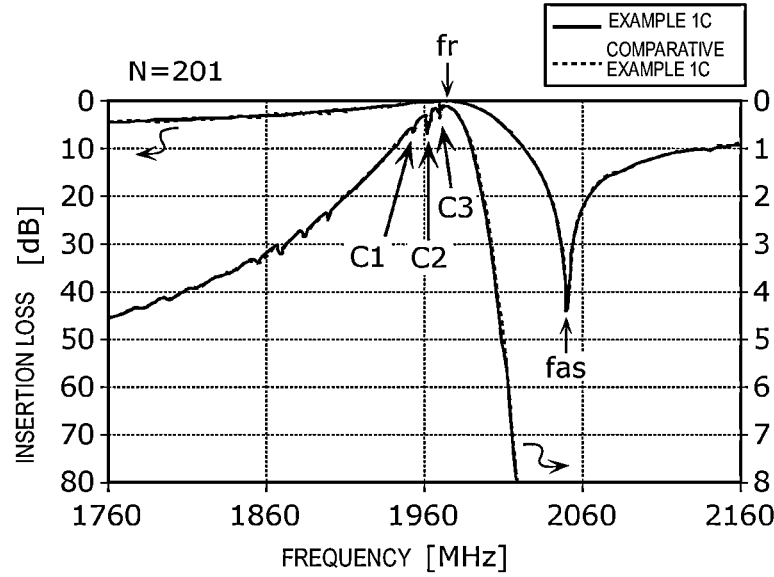
FIG. 3C is a diagram illustrating insertion losses of acoustic wave elements of Comparative Example 1C and Example 1C (in a case where the total number of comb electrode fingers is 201).

FIG. 3C is a diagram illustrating insertion losses of acoustic wave elements of Comparative Example 1C and Example 1C (in a case where the total number of comb electrode fingers is 201). FIG. 3C illustrates that the return loss is increased as approaching a lower side of a vertical axis.

In each of Comparative Example 1C and Example 1C, the number of pairs of IDT electrodes 11 is 100, and the total number N of the comb electrode fingers 11a and 11b is 201.

Comparative Example 1C is an example in which pitches of the plurality of comb electrode fingers 11a and 11b of the IDT electrode 11 are all the same or substantially the same.

Example 1C is an example in which a pitch of two comb electrode fingers adjacent to each other at a predetermined position in a direction from an end toward a center of the IDT electrode 11 is smaller than the average pitch. Specifically, in Example 1C, the pitch of the two comb electrode fingers is set to, for example, about 0.98 times the average pitch.

As illustrated in FIG. 3C, in Comparative Example 1C, ripples C1, C2, and C3 are generated on a low-frequency side of the resonant frequency fr of the acoustic wave element. In contrast, in Example 1C, the generation of each of the ripples C1, C2, and C3 is prevented. In this manner, by making the pitch of the two comb electrode fingers adjacent to each other at the predetermined position spaced away from the end smaller than the average pitch, it is possible to reduce the ripple generated on the low-frequency side than the resonant frequency fr of the acoustic wave element 10.

It is preferable that the pitch of the two comb electrode fingers is the smallest in all the pitches configured with all the comb electrode fingers 11a and 11b.

Figure 4C:
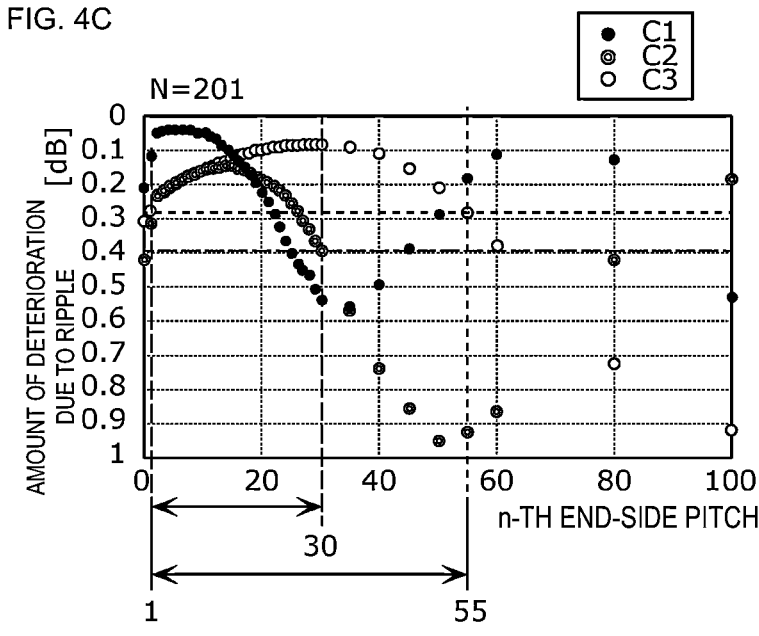
FIG. 4C is a diagram illustrating the amount of deterioration due to a ripple in a case where a position of a pitch of two comb electrode fingers smaller than an average pitch is changed (in a case where the total number of comb electrode fingers is 201).

FIG. 4C is a diagram illustrating the amount of deterioration due to a ripple in a case where a position of a pitch of two comb electrode fingers smaller than an average pitch is changed (in a case where the total number of comb electrode fingers is 201).

FIG. 4C illustrates an example in which n of an n-th end-side pitch, which is a pitch between the n-th end-side electrode finger and the (n+1)-th end-side electrode finger is changed from 1 to 100 in order, as an example in which the position of the pitch of the two comb electrode fingers is sequentially changed. The pitch of the two comb electrode fingers is 0.98 times the average pitch. In FIG. 4C, n=0 on a horizontal axis indicates a case where the pitch of the two comb electrode fingers is not changed. The n-th end-side electrode finger has a relationship of n<(N/2−m) not to be located on a central side of the m-th inner-side electrode finger described above.

FIG. 4C illustrates a position of the n-th end-side pitch when the center side is viewed from one end of the IDT electrode 11, and in the present example, the same or substantially the same configuration is also applied to the n-th end-side pitch when the center side is viewed from the other end. That is, the acoustic wave element 10 has two n-th end-side pitches, and the two n-th end-side pitches are located to be line-symmetric with respect to a center line passing through the center of the IDT electrode 11 in the acoustic wave propagation direction.

As illustrated in FIG. 4C, the amount of deterioration due to each of the ripples C1, C2, and C3 is changed by changing the position of the pitch of the two comb electrode fingers smaller than the average pitch. Therefore, by setting the position of the pitch of the two comb electrode fingers smaller than the average pitch in a predetermined range, the amount of deterioration due to each of the ripples C1, C2, and C3 can be reduced or prevented.

For example, by setting n of the n-th end-side pitch in a range of $1 \leq n \leq 55$, the amount of deterioration due to each of the ripples C1, C2, and C3 can be improved more than the monitoring (n=0) which is Comparative Example 1C. When an upper limit value of n of the n-th end-side pitch is represented by using the total number N of the plurality of comb electrode fingers 11a and 11b, 55/201=0.275. Therefore, in the acoustic wave element 10, by setting the position of the n-th end-side pitch, which is smaller than the average pitch, in a range illustrated in (Formula 1C) below, the amount of deterioration caused by each of the ripples C1, C2, and C3 can be improved than the monitoring (n=0).

$$1 \leq n \leq (0.275 \times N) \qquad \text{(Formula 1C)}$$

Further, for example, by setting n of the n-th end-side pitch in a range of $1 \leq n \leq 30$, the amount of deterioration due to each of the ripples C1, C2, and C3 can be further improved than the monitoring (n=0). When an upper limit value of n of the n-th end-side pitch is represented by using the total number N of the plurality of comb electrode fingers 11a and 11b, 30/201=0.150. Therefore, in the acoustic wave element 10, by setting the position of the n-th end-side pitch, which is smaller than the average pitch, in a range illustrated in (Formula 3C) below, the amount of deterioration caused by each of the ripples C1, C2, and C3 can be further improved than the monitoring (n=0).

$$1 \leq n \leq (0.150 \times N) \qquad \text{(Formula 3C)}$$

Since the lower limit values of n of the n-th end-side pitch in (Formula 1A), (Formula 1B), (Formula 1C), (Formula 3B), and (Formula 3C) of Examples 1A to 1C are the same or substantially the same even if the total numbers of comb electrode fingers are different from each other, the lower limit value is maintained as 1 without using the total number N for representing.

Next, Examples 2A to 2C will be described with reference to FIGS. 5A to 5C and 6A to 6C. In Examples 2A to 2C, an example in which a pitch of two comb electrode fingers adjacent to each other at a predetermined position in a direction from a center to an end of the IDT electrode 11 is larger than an average pitch will be described.

Example 2A

Figure 5A:
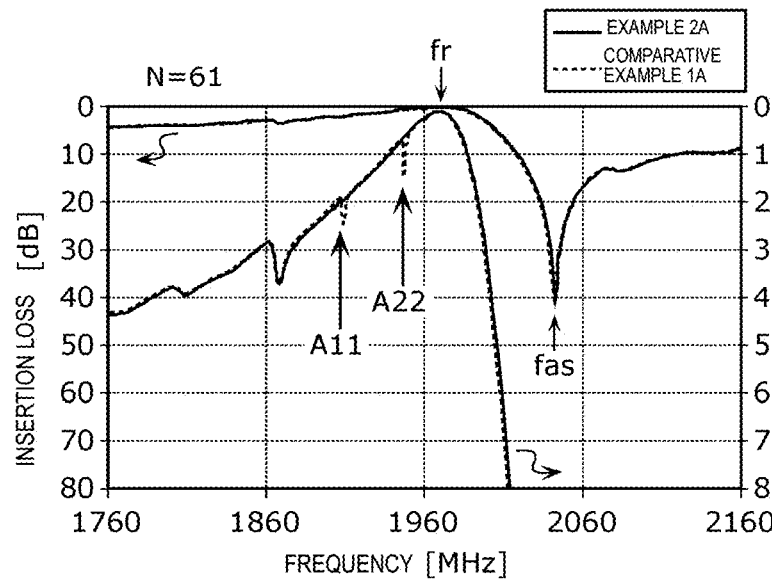
FIG. 5A is a diagram illustrating insertion losses of acoustic wave elements of Comparative Example 1A and Example 2A (in a case where the total number of comb electrode fingers is 61).

FIG. 5A is a diagram illustrating insertion losses of acoustic wave elements according to Comparative Example 1A and Example 2A (in a case where the total number of comb electrode fingers is 61). FIG. 5A illustrates that the return loss is increased as approaching a lower side of a vertical axis. The number of pairs of the IDT electrodes 11 is 30, and the total number N of the comb electrode fingers 11a and 11b is 61.

Comparative Example 1A is an example in which the pitches of the plurality of comb electrode fingers 11a and 11b of the IDT electrode 11 are all the same or substantially the same.

Example 2A is an example in which a pitch of two comb electrode fingers adjacent to each other at a predetermined position in a direction from a center to an end of the IDT electrode 11 is larger than the average pitch. Specifically, in Example 2A, the pitch of the two comb electrode fingers is set to, for example, about 1.02 times the average pitch.

As illustrated in FIG. 5A, in Comparative Example 1A, ripples A11 and A22 are generated on a low-frequency side of the resonant frequency fr of an acoustic wave element. In contrast, in Example 2A, the generation of each of the ripples A11 and A22 is prevented. In this manner, by making the pitch of the two comb electrode fingers adjacent to each other at the predetermined position spaced away from the center larger than the average pitch, it is possible to reduce the ripple generated on the low-frequency side than the resonant frequency fr of the acoustic wave element 10.

It is preferable that the pitch of the two comb electrode fingers is the largest among all the pitches configured with the plurality of comb electrode fingers 11a and 11b.

Figure 6A:
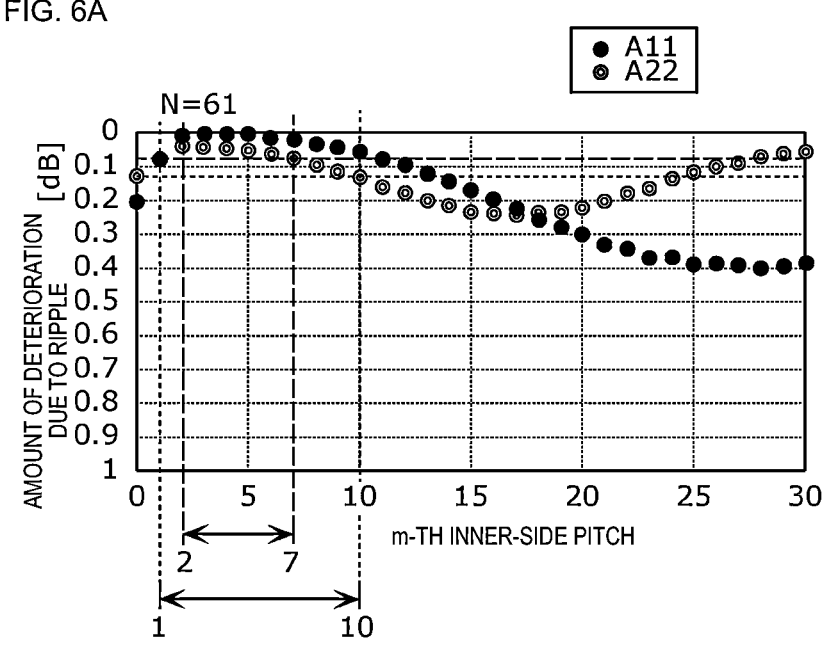
FIG. 6A is a diagram illustrating the amount of deterioration due to a ripple in a case where a position of a pitch of two comb electrode fingers larger than the average pitch is changed (in a case where the total number of comb electrode fingers is 61).

FIG. 6A is a diagram illustrating the amount of deterioration due to a ripple in a case where a position of a pitch of two comb electrode fingers larger than the average pitch is changed (in a case where the total number of comb electrode fingers is 61).

FIG. 6A illustrates an example in which m of an m-th inner-side pitch, which is a pitch between the m-th inner-side electrode finger and the (m−1)-th inner-side electrode finger is changed from 1 to 30 in order, as an example in which the position of the pitch of the two comb electrode fingers is sequentially changed. The pitch of the two comb electrode fingers is 1. 02 times the average pitch. In FIG. 6A, m=0 on a horizontal axis indicates a case where the pitch of the two comb electrode fingers is not changed. The m-th inner-side electrode finger has a relationship of m<(N/2−n−1) not to be located on the reflector 12 side of the (n+1)-th end electrode finger described above.

FIG. 6A illustrates a position of the m-th inner-side pitch when one end side is viewed from a center of the IDT electrode 11, and in the present example, the same configuration is also applied to the m-th inner-side pitch when the other end side is viewed from the center. That is, the acoustic wave element 10 has two m-th inner-side pitches, and the two m-th inner-side pitches are located to be line-symmetric with respect to a center line passing through the center of the IDT electrode 11 in the acoustic wave propagation direction.

As illustrated in FIG. 6A, the amount of deterioration due to each of the ripples A11 and A22 is changed by changing the position of the pitch of the two comb electrode fingers larger than the average pitch. Therefore, by setting the position of the pitch of the two comb electrode fingers smaller than the average pitch in a predetermined range, the amount of deterioration due to each of the ripples A11 and A22 can be reduced.

For example, by setting m of the m-th inner-side pitch in a range of 1 m 10, the amount of deterioration due to each of the ripples A11 and A22 can be improved more than the monitoring (m=0) which is Comparative Example 1A. When an upper limit value of m of the m-th inner-side pitch is represented by using the total number N of the plurality of comb electrode fingers 11a and 11b, 10/61=0.167. Therefore, in the acoustic wave element 10, by setting the position of the m-th inner-side pitch, which is larger than the average pitch, in a range illustrated in (Formula 2A) below, the amount of deterioration due to each of the ripples A11 and A22 can be improved than the monitoring (m=0).

$$1 \leq m \leq (0.167 \times N) \qquad \text{(Formula 2A)}$$

Further, for example, by setting m of the m-th inner-side pitch in a range of $2 \leq m \leq 7$, the amount of deterioration due to each of the ripples A11 and A22 can be further improved than the monitoring (m=0). When an upper limit value of m of the m-th inner-side pitch is represented by using the total number N of the plurality of comb electrode fingers 11a and 11b, 7/61=0.117. Therefore, in the acoustic wave element 10, by setting the position of the m-th inner-side pitch, which is larger than the average pitch, in a range illustrated in (Formula 4A) below, the amount of deterioration due to each of the ripples A11 and A22 can be further improved than the monitoring (m=0).

$$2 \leq m \leq (0.117 \times N) \qquad \text{(Formula 4A)}$$

Example 2B

Figure 5B:
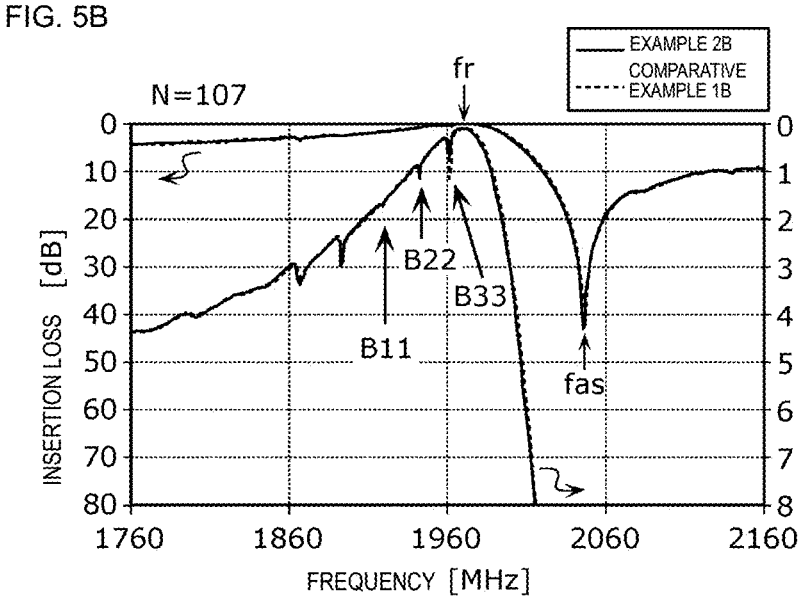
FIG. 5B is a diagram illustrating insertion losses of acoustic wave elements of Comparative Example 1B and Example 2B (in a case where the total number of comb electrode fingers is 107).

FIG. 5B is a diagram illustrating insertion losses of acoustic wave elements of Comparative Example 1B and Example 2B (in a case where the total number of comb electrode fingers is 107). FIG. 5B illustrates that the return loss is increased as approaching a lower side of a vertical axis. The number of pairs of the IDT electrodes 11 is 53, and the total number N of the comb electrode fingers 11a and 11b is 107.

Comparative Example 1B is an example in which pitches of the plurality of comb electrode fingers 11a and 11b of the IDT electrode 11 are all the same or substantially the same.

Example 2B is an example in which a pitch of two comb electrode fingers adjacent to each other at a predetermined position in a direction from a center to an end of the IDT electrode 11 is larger than the average pitch. Specifically, in Example 2B, the pitch of the two comb electrode fingers is set to, for example, about 1.02 times the average pitch.

As illustrated in FIG. 5B, in Comparative Example 1B, ripples B11, B22, and B33 are generated on a low-frequency side of the resonant frequency fr of the acoustic wave element. On the other hand, in Example 2B, the generation of each of the ripples B11, B22, and B33 is prevented. In this manner, by making the pitch of the two comb electrode fingers adjacent to each other at the predetermined position spaced away from the center larger than the average pitch, it is possible to reduce the ripple generated on the low-frequency side than the resonant frequency fr of the acoustic wave element 10.

It is preferable that the pitch of the two comb electrode fingers is the largest among all the pitches configured with the plurality of comb electrode fingers 11a and 11b.

Figure 6B:
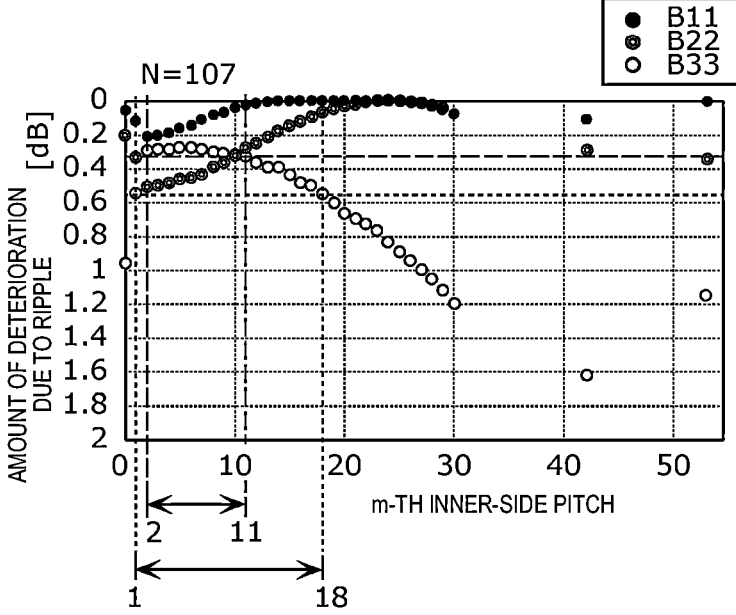
FIG. 6B is a diagram illustrating the amount of deterioration due to a ripple in a case where a position of a pitch of two comb electrode fingers larger than the average pitch is changed (in a case where the total number of comb electrode fingers is 107).

FIG. 6B is a diagram illustrating the amount of deterioration due to a ripple in a case where a position of a pitch of two comb electrode fingers larger than the average pitch is changed (in a case where the total number of comb electrode fingers is 107).

FIG. 6B illustrates an example in which m of an m-th inner-side pitch, which is a pitch between the m-th inner-side electrode finger and the (m−1)-th inner-side electrode finger is changed from 1 to 53 in order, as an example in which the position of the pitch of the two comb electrode fingers is sequentially changed. The pitch of the two comb electrode fingers is 1.02 times the average pitch. In FIG. 6B, m=0 on a horizontal axis indicates a case where the pitch of the two comb electrode fingers is not changed. The m-th inner-side electrode finger has a relationship of m<(N/2−n−1) not to be located on the reflector 12 side of the (n+1)-th end electrode finger described above.

FIG. 6B illustrates a position of the m-th inner-side pitch when one end side is viewed from a center of the IDT electrode 11, and in the present example, the same or substantially the same configuration is also applied to the m-th inner-side pitch when the other end side is viewed from the center. That is, the acoustic wave element 10 has two m-th inner-side pitches, and the two m-th inner-side pitches are located to be line-symmetric with respect to a center line passing through the center of the IDT electrode 11 in the acoustic wave propagation direction.

As illustrated in FIG. 6B, the amount of deterioration due to each of the ripples B11, B22, and B33 is changed by changing the position of the pitch of the two comb electrode fingers larger than the average pitch. Therefore, by setting the position of the pitch of the two comb electrode fingers smaller than the average pitch in a predetermined range, the amount of deterioration due to each of the ripples B11, B22, and B33 can be reduced.

For example, by setting m of the m-th inner-side pitch in a range of 1 m 18, the amount of deterioration due to each of the ripples B11, B22, and B33 can be improved more than the monitoring (m=0) which is Comparative Example 1B. When an upper limit value of m of the m-th inner-side pitch is represented by using the total number N of the plurality of comb electrode fingers 11a and 11b, 18/107=0.170. Therefore, in the acoustic wave element 10, by setting the position of the m-th inner-side pitch, which is larger than the average pitch, in a range illustrated in (Formula 2B) below, the amount of deterioration due to each of the ripples B11, B22, and B33 can be improved than the monitoring (m=0).

$$1 \leq m \leq (0.170 \times N) \tag{Formula 2B}$$

Further, for example, by setting m of the m-th inner-side pitch in a range of $2 \leq m \leq 11$, the amount of deterioration due to each of the ripples B11, B22, and B33 can be further improved than the monitoring (m=0). When an upper limit value of m of the m-th inner-side pitch is represented by using the total number N of the plurality of comb electrode fingers 11a and 11b, 11/107=0.104. Therefore, in the acoustic wave element 10, by setting the position of the m-th inner-side pitch, which is larger than the average pitch, in a range illustrated in (Formula 4B) below, the amount of deterioration due to each of the ripples B11, B22, and B33 can be further improved than the monitoring (m=0).

$$2 \leq m \leq (0.104 \times N) \tag{Formula 4B}$$

Example 2C

Figure 5C:
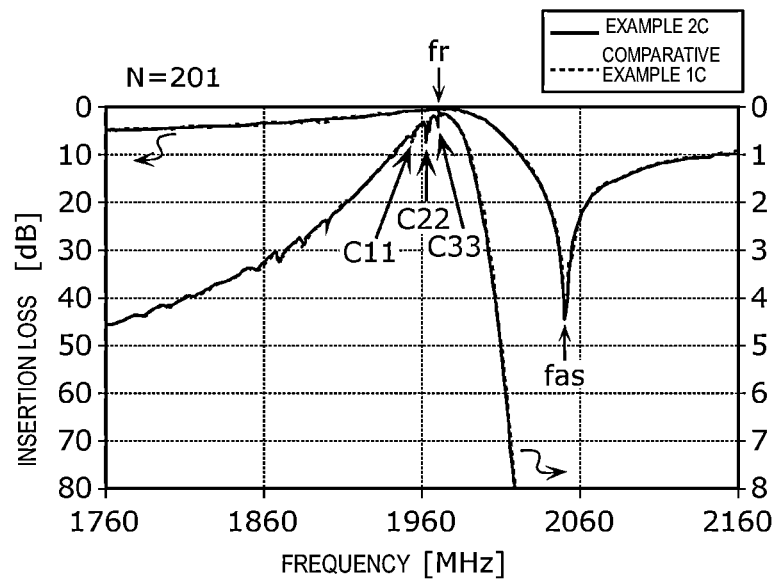
FIG. 5C is a diagram illustrating insertion losses of acoustic wave elements of Comparative Example 1C and Example 2C (in a case where the total number of comb electrode fingers is 201).

FIG. 5C is a diagram illustrating insertion losses of acoustic wave elements of Comparative Example 1C and Example 2C (in a case where the total number of comb electrode fingers is 201). FIG. 5C illustrates that the return loss is increased as approaching a lower side of a vertical axis. The number of pairs of the IDT electrodes 11 is 100, and the total number N of the comb electrode fingers 11a and 11b is 201.

Comparative Example 1C is an example in which pitches of the plurality of comb electrode fingers 11a and 11b of the IDT electrode 11 are all the same or substantially the same.

Example 2C is an example in which a pitch of two comb electrode fingers adjacent to each other at a predetermined position in a direction from a center to an end of the IDT electrode 11 is larger than the average pitch. Specifically, in Example 2C, the pitch of the two comb electrode fingers is set to, for example, about 1.02 times the average pitch.

As illustrated in FIG. 5C, in Comparative Example 1C, ripples C11, C22, and C33 are generated on a low-frequency side of the resonant frequency fr of the acoustic wave element. On the other hand, in Example 2C, the generation of each of the ripples C11, C22, and C33 is prevented. In this manner, by making the pitch of the two comb electrode fingers adjacent to each other at the predetermined position spaced away from the center larger than the average pitch, it is possible to reduce the ripple generated on the low-frequency side than the resonant frequency fr of the acoustic wave element 10.

It is preferable that the pitch of the two comb electrode fingers is the largest among all the pitches of the plurality of comb electrode fingers 11a and 11b.

Figure 6C:
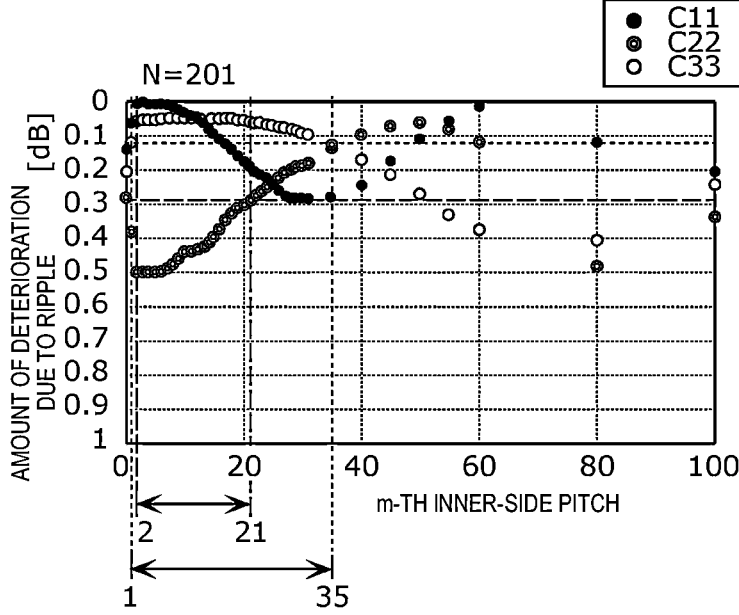
FIG. 6C is a diagram illustrating the amount of deterioration due to a ripple in a case where a position of a pitch of two comb electrode fingers larger than the average pitch is changed (in a case where the total number of comb electrode fingers is 201).

FIG. 6C is a diagram illustrating the amount of deterioration due to a ripple in a case where a position of a pitch of two comb electrode fingers larger than the average pitch is changed (in a case where the total number of comb electrode fingers is 201).

FIG. 6C illustrates an example in which m of an m-th inner-side pitch, which is a pitch between the m-th inner-side electrode finger and the (m−1)-th inner-side electrode finger is changed from 1 to 100 in order, as an example in which the position of the pitch of the two comb electrode fingers is sequentially changed. The pitch of the two comb electrode fingers is 1.02 times the average pitch. In FIG. 6C, m=0 on a horizontal axis indicates a case where the pitch of the two comb electrode fingers is not changed. The m-th inner-side electrode finger has a relationship of m<(N/2−n−1) not to be located on the reflector 12 side of the (n+1)-th end electrode finger described above.

FIG. 6C illustrates a position of the m-th inner-side pitch when one end side is viewed from a center of the IDT electrode 11, and in the present example, the same or substantially the same configuration is also applied to the m-th inner-side pitch when the other end side is viewed from the center. That is, the acoustic wave element 10 has two m-th inner-side pitches, and the two m-th inner-side pitches are located to be line-symmetric with respect to a center line passing through the center of the IDT electrode 11 in the acoustic wave propagation direction.

As illustrated in FIG. 6C, the amount of deterioration due to each of the ripples C11, C22, and C33 is changed by changing the position of the pitch of the two comb electrode fingers larger than the average pitch. Therefore, by setting the position of the pitch of the two comb electrode fingers smaller than the average pitch in a predetermined range, the amount of deterioration due to each of the ripples C11, C22, and C33 can be reduced.

For example, by setting m of the m-th inner-side pitch in a range of 1 m 35, the amount of deterioration due to each of the ripples C11, C22, and C33 can be improved more than the monitoring (m=0) which is Comparative Example 1C. When an upper limit value of m of the m-th inner-side pitch is represented by using the total number N of the plurality of comb electrode fingers 11a and 11b, 35/201=0.175. Therefore, in the acoustic wave element 10, by setting the position of the m-th inner-side pitch, which is larger than the average pitch, in a range illustrated in (Formula 2C) below, the amount of deterioration due to each of the ripples C11, C22, and C33 can be improved than the monitoring (m=0).

$$1 \leq m \leq (0.175 \times N) \qquad \text{(Formula 2C)}$$

Further, for example, by setting m of the m-th inner-side pitch in a range of 2≤m≤21, the amount of deterioration due to each of the ripples C11, C22, and C33 can be further improved than the monitoring (m=0). When an upper limit value of m of the m-th inner-side pitch is represented by using the total number N of the plurality of comb electrode fingers 11a and 11b, 21/201=0.105. Therefore, in the acoustic wave element 10, by setting the position of the m-th inner-side pitch, which is larger than the average pitch, in a range illustrated in (Formula 4C) below, the amount of deterioration due to each of the ripples C11, C22, and C33 can be further improved than the monitoring (m=0).

$$2 \leq m \leq (0.105 \times N) \qquad \text{(Formula 4C)}$$

Since the lower limit values of m of the m-th inner-side pitch in (Formula 2A), (Formula 2B), and (Formula 2C) of Examples 2A to 2C are the same or substantially the same even if the total numbers of comb electrode fingers are different from each other, the lower limit value is maintained as 1 without using the total number N for representing. Since the lower limit values of m of the m-th inner-side pitch in (Formula 4A), (Formula 4B), and (Formula 4C) of Examples 2A to 2C are the same or substantially the same even if the total numbers of comb electrode fingers are different from each other, the lower limit value is maintained as 2 without using the total number N for representing.

1. 3 Examples 3, 4, and 5

Examples 3, 4, and 5 will be described with reference to FIGS. 7A to 8B.

FIGS. 7A to 7D are diagrams illustrating insertion losses of acoustic wave elements of Comparative Example 2 and Examples 3, 4, and 5.

In each of Comparative Example 2 and Examples 3 to 5, the number of pairs of IDT electrodes 11 is 53, and the total number N of the comb electrode fingers 11a and 11b is 107. The IDT-reflector gap described above is, for example, about 0.45 times or less of a reflector wavelength, and the IDT wavelength is smaller than the reflector wavelength.

Figures 7A, 7B, 7C, 7D:
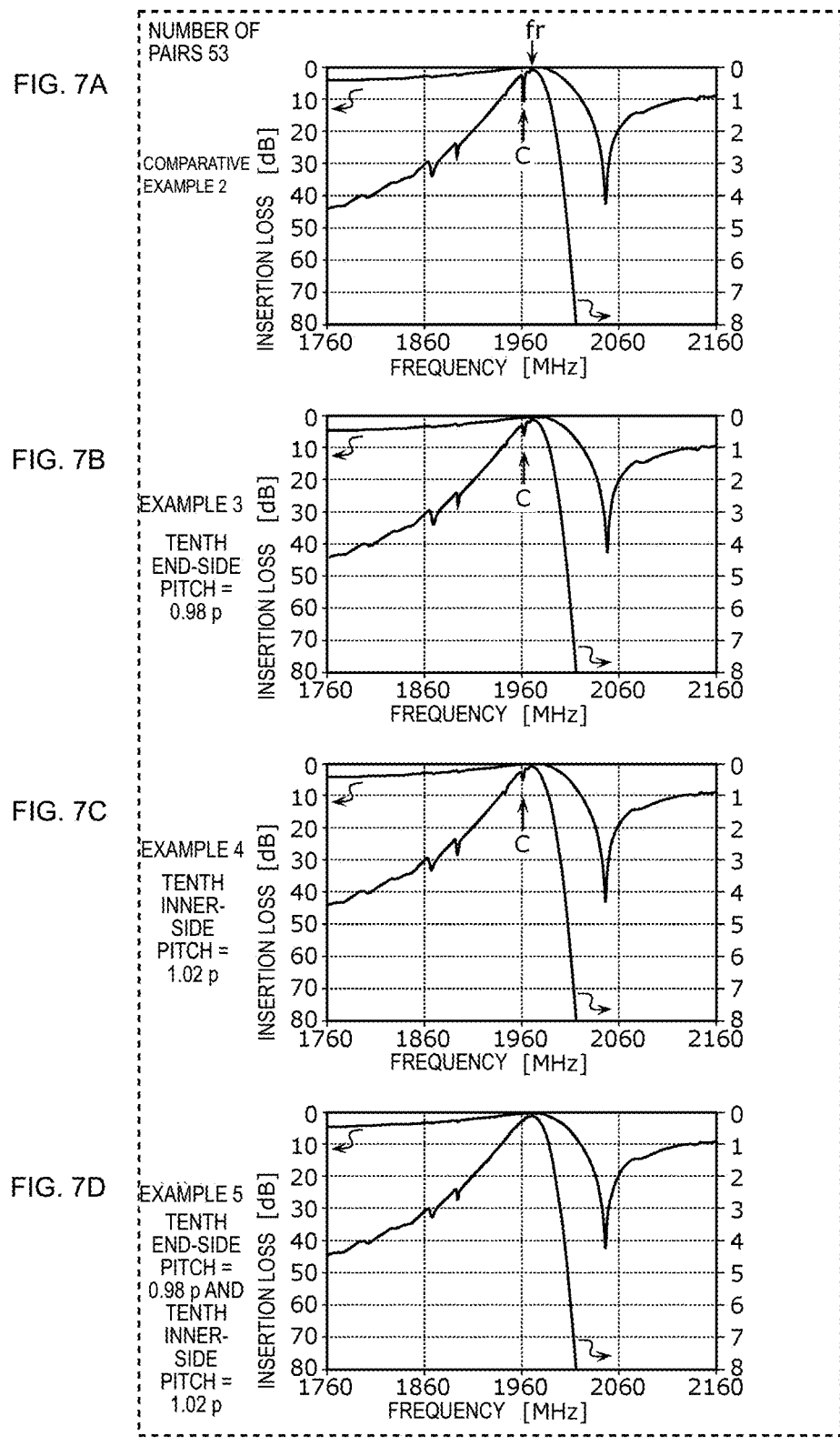
FIGS. 7A to 7D are diagrams illustrating insertion losses of acoustic wave elements of Comparative Example 2 and Examples 3, 4, and 5.

FIG. 7A is Comparative Example 2, and is an example in which pitches of the plurality of comb electrode fingers 11a and 11b of the IDT electrode 11 are all the same or substantially the same. In Comparative Example 2, a ripple C is generated on a low-frequency side of the resonant frequency fr of the acoustic wave element.

FIG. 7B is Example 3, and is an example in which a tenth end-side pitch is set to, for example, about 0.98 p. Since n=10 of the n-th end-side pitch is the total number N=107, a condition of (Formula 1B) is satisfied. About 0.98 p is a value when an average pitch of all the comb electrode fingers 11a and 11b of the IDT electrode 11 is set to 1 p. In Example 3, the amount of generation of the ripple C on the low-frequency side of the resonant frequency fr of the acoustic wave element 10 can be reduced or prevented more than in Comparative Example 2.

FIG. 7C is Example 4, and is an example in which a tenth inner-side pitch is set to, for example, about 1.02 p. Since m=10 of the m-th inner-side pitch is the total number N=107, a condition of (Formula 2B) is satisfied. About 1.02 p is a value when the average pitch of all the comb electrode fingers 11a and 11b of the IDT electrode 11 is set to 1 p. In Example 4, the amount of generation of the ripple C on the low-frequency side of the resonant frequency fr of the acoustic wave element 10 can be reduced more than in Comparative Example 2.

FIG. 7D is Example 5, and is an example in which a tenth end-side pitch is set to, for example, about 0.98 p and a tenth inner-side pitch is set to, for example, about 1.02 p. About 0.98 p and about 1.02 p are values when the average pitch of all the comb electrode fingers 11a and 11b of the IDT electrode 11 is set to 1 p. In Example 5, the generation of the ripple C on the low-frequency side of the resonant frequency fr of the acoustic wave element 10 can be prevented more than in Comparative Example 2, and Examples 3 and 4.

Figures 8A, 8B:
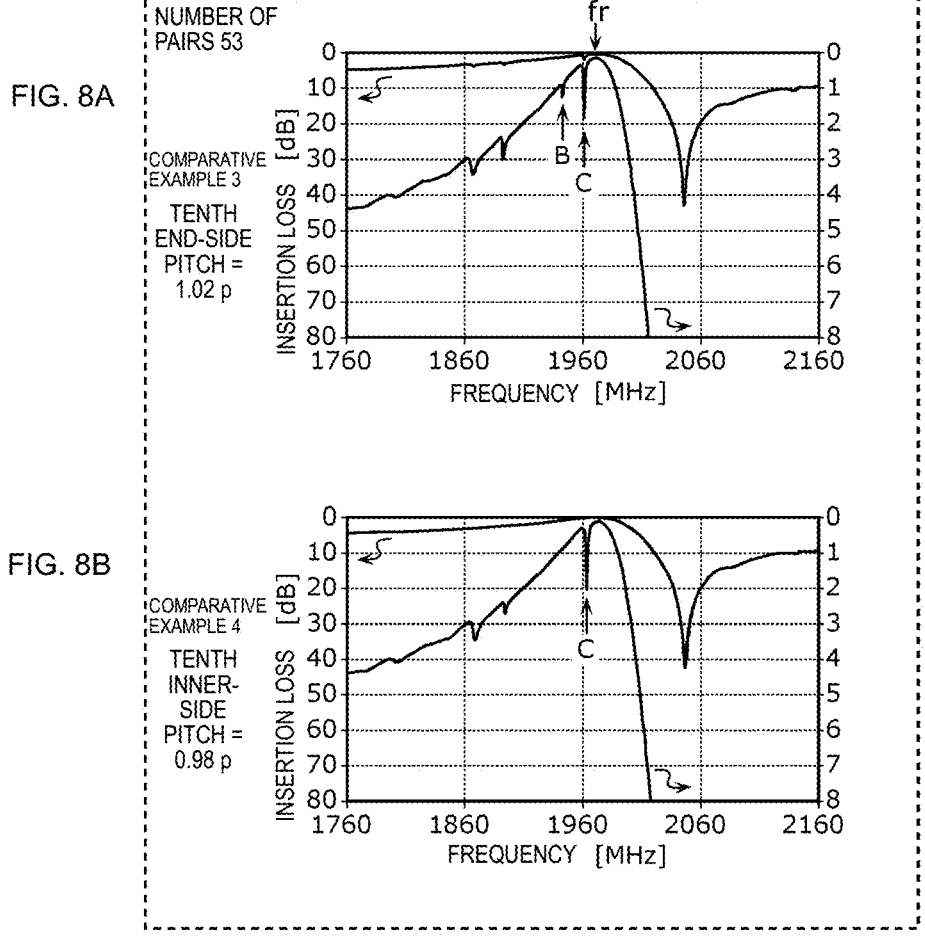
FIGS. 8A and 8B are diagram illustrating insertion losses of acoustic wave elements of Comparative Examples 3 and 4.

FIGS. 8A and 8B are diagrams illustrating insertion losses of acoustic wave elements of Comparative Examples 3 and 4. In each acoustic wave element, the number of pairs of the IDT electrodes 11 is 53, and the total number N of the comb electrode fingers 11a and 11b is 107.

FIG. 8A is Comparative Example 3, and is an example in which a tenth end-side pitch is set to, for example, about 1.02 p. That is, Comparative Example 3 is an example in which a pitch of two comb electrode fingers adjacent to each other at a predetermined position spaced away from an end of the IDT electrode 11 is larger than an average pitch. In Comparative Example 3, a ripple B is generated on the low-frequency side of the resonant frequency fr of the acoustic wave element, and the ripple C is increased.

FIG. 8B is Comparative Example 4, and is an example in which a tenth inner-side pitch is set to, for example, about 0.98 p. That is, Comparative Example 4 is an example in which a pitch of two comb electrode fingers adjacent to each other at a predetermined position spaced away from a center of the IDT electrode 11 is smaller than an average pitch. In Comparative Example 4, the ripple C is increased on the low-frequency side of the resonant frequency fr of the acoustic wave element.

That is, as illustrated in Comparative Example 2 in FIG. 7A, when the pitches of the plurality of comb electrode fingers 11a and 11b of the IDT electrode 11 are all the same or substantially the same, the ripple C is generated on the low-frequency side of the resonant frequency fr of the acoustic wave element.

As illustrated in Comparative Example 3 in FIG. 8A, when the pitch of the two comb electrode fingers adjacent to each other at the predetermined position spaced away from the end of the IDT electrode 11 is larger than the average pitch, the ripple generated on the low-frequency side of the resonant frequency fr of the acoustic wave element 10 deteriorates. As illustrated in Comparative Example 4 in FIG. 8B, when the pitch of the two comb electrode fingers adjacent to each other at the predetermined position spaced away from the center of the IDT electrode 11 is smaller than the average pitch, the ripple generated on the low-frequency side of the resonant frequency fr of the acoustic wave element 10 deteriorates.

As illustrated in Examples 3 and 5 in FIGS. 7B and 7D, when the pitch of the two comb electrode fingers adjacent to each other at the predetermined position spaced away from the end of the IDT electrode 11 is smaller than the average pitch, the ripple generated on the low-frequency side of the resonant frequency fr of the acoustic wave element 10 can be reduced. As illustrated in Examples 4 and 5 in FIGS. 7C and 7D, the pitch of the two comb electrode fingers adjacent to each other at the predetermined position spaced away from the center of the IDT electrode 11 is larger than the average pitch, the ripple generated on the low-frequency side of the resonant frequency fr of the acoustic wave element 10 can be reduced or prevented.

1. 4 Examples 6, 7, and 8

Examples 6, 7, and 8 will be described with reference to FIGS. 9A to 9D. In Examples 6 to 8, an example in which the number of pairs of the IDT electrodes 11 is smaller than Examples 3 to 5 will be described.

FIGS. 9A to 9D are diagrams illustrating insertion losses of acoustic wave elements of Comparative Example 5 and Examples 6, 7, and 8.

In each of Comparative Example 5 and Examples 6 to 8, the number of pairs of IDT electrodes 11 is 30, and the total number N of the comb electrode fingers 11a and 11b is 61. The IDT-reflector gap described above is, for example, about 0.45 times or less of a reflector wavelength, and the IDT wavelength is smaller than the reflector wavelength.

Figures 9A, 9B, 9C, 9D:
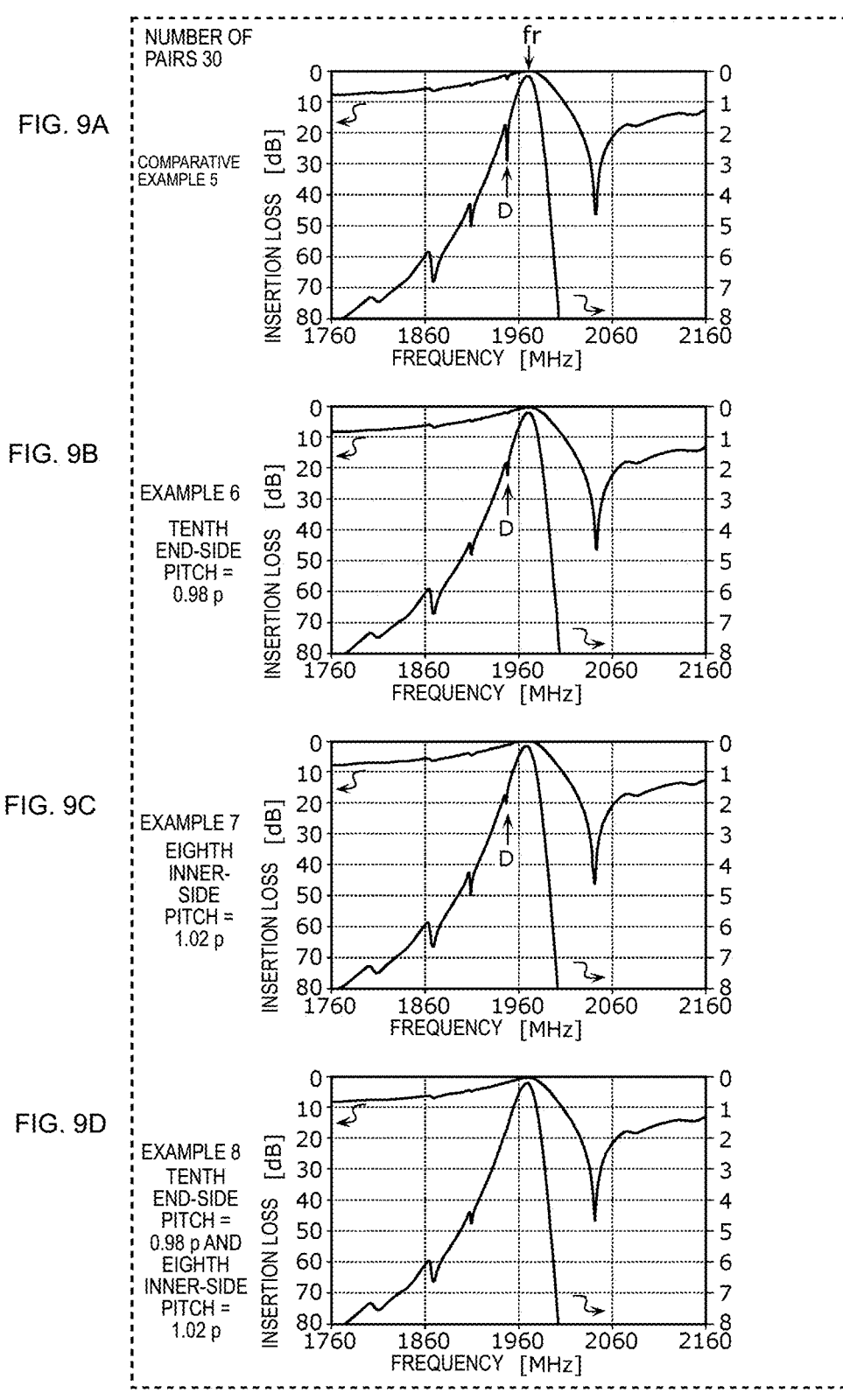
FIGS. 9A to 9D are diagrams illustrating insertion losses of acoustic wave elements of Comparative Example 5 and Examples 6, 7, and 8.

FIG. 9A is Comparative Example 5, and is an example in which pitches of the plurality of comb electrode fingers 11a and 11b of the IDT electrode 11 are all the same or substantially the same. In Comparative Example 5, a ripple D is generated on a low-frequency side of the resonant frequency fr of the acoustic wave element.

FIG. 9B is Example 6, and is an example in which a tenth end-side pitch is set to, for example, about 0.98 p. Since n=10 of the n-th end-side pitch is the total number N=61, a condition of (Formula 1A) is satisfied. About 0.98 p is a value when the average pitch of all the comb electrode fingers 11a and 11b of the IDT electrode 11 is set to 1 p. In Example 6, the amount of generation of the ripple D on the low-frequency side of the resonant frequency fr of the acoustic wave element 10 can be reduced more than in Comparative Example 5.

FIG. 9C is Example 7, and is an example in which an eighth inner-side pitch is set to, for example, about 1.02 p. Since m=8 of the m-th inner-side pitch is the total number N=61, a condition of (Formula 2A) is satisfied. About 1.02 p is a value when the average pitch of all the comb electrode fingers 11a and 11b of the IDT electrode 11 is set to 1 p. In Example 7, the amount of generation of the ripple D on the low-frequency side of the resonant frequency fr of the acoustic wave element 10 can be reduced more than in Comparative Example 5.

FIG. 9D is Example 8, and is an example in which a tenth end-side pitch is set to, for example, about 0.98 p and an eighth inner-side pitch is set to 1.02 p. About 0.98 p and about 1.02 p are values when the average pitch of all the comb electrode fingers 11a and 11b of the IDT electrode 11 is set to 1 p. In Example 8, the generation of the ripple D on the low-frequency side of the resonant frequency fr of the acoustic wave element 10 can be prevented more than in Comparative Example 5, and Examples 6 and 7.

As illustrated in Examples 6 and 8 in FIGS. 9B and 9D, even in a case where the number of pairs of the IDT electrode 11 is 30, when the pitch of the two comb electrode fingers adjacent to each other at the predetermined position spaced away from the end of the IDT electrode 11 is smaller than the average pitch, the ripple generated on the low-frequency side of the resonant frequency fr of the acoustic wave element 10 can be reduced. As illustrated in Examples 7 and 8 in FIGS. 9C and 9D, even in a case where the number of pairs of the IDT electrode 11 is 30, the pitch of the two comb electrode fingers adjacent to each other at the predetermined position spaced away from the center of the IDT electrode 11 is larger than the average pitch, the ripple generated on the low-frequency side of the resonant frequency fr of the acoustic wave element 10 can be reduced or prevented.

1. 5 Example 9

Example 9 will be described with reference to FIGS. 10A and 10B. In Example 9, an example in which the number of pairs of IDT electrodes 11 is larger than Examples 3 to 5 will be described.

Figures 10A, 10B, 11:
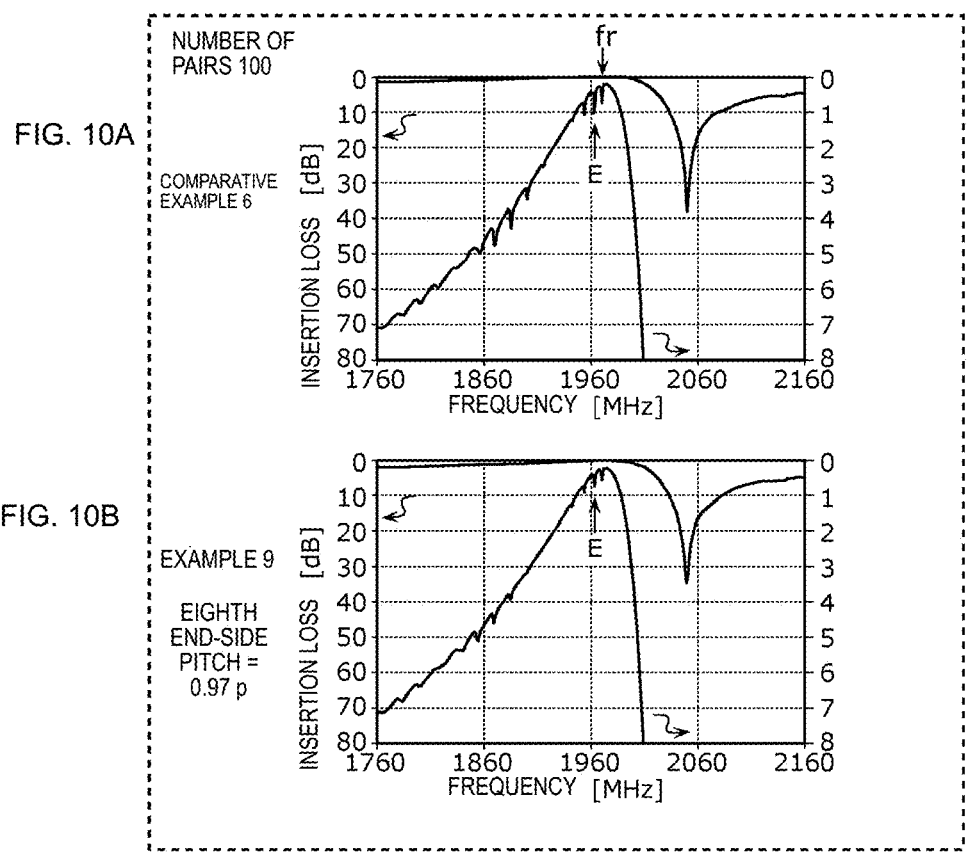
FIGS. 10A and 10B are diagrams illustrating insertion losses of acoustic wave elements of Comparative Example 6 and Example 9.
FIG. 11 is a diagram illustrating an example of a pitch of the comb electrode finger.

FIGS. 10A and 10B are diagrams illustrating insertion losses of acoustic wave elements of Comparative Example 6 and Example 9.

In each of Comparative Example 6 and Example 9, the number of pairs of IDT electrodes 11 is 100, and the total number N of comb electrode fingers 11a and 11b is 201. The IDT-reflector gap described above is 0.45 times or less of a reflector wavelength, and the IDT wavelength is smaller than the reflector wavelength.

FIG. 10A is Comparative Example 6, and is an example in which pitches of the plurality of comb electrode fingers 11a and 11b of the IDT electrode 11 are all the same. In Comparative Example 6, a ripple E is generated on a low-frequency side of the resonant frequency fr of the acoustic wave element.

FIG. 10B is Example 9, and is an example in which an eighth end-side pitch is set to, for example, about 0.97 p. Since n=8 of the n-th end-side pitch is the total number N=201, a condition of (Formula 1C) is satisfied. About 0.97 p is a value when the average pitch of all the comb electrode fingers 11a and 11b of the IDT electrode 11 is set to 1 p. In Example 9, the amount of generation of the ripple E on the low-frequency side of the resonant frequency fr of the acoustic wave element 10 can be reduced more than in Comparative Example 6.

As illustrated in Example 9 in FIG. 10B, even in a case where the number of pairs of the IDT electrode 11 is 100, when the pitch of the two comb electrode fingers adjacent to each other at the predetermined position spaced away from the end of the IDT electrode 11 is smaller than the average pitch, the ripple generated on the low-frequency side of the resonant frequency fr of the acoustic wave element 10 can be reduced or prevented.

1. 6 Examples 10, 11, and 12

Examples 10, 11, and 12 will be described with reference to FIG. 11. In Examples 10 to 12, an example in which one or a plurality of n-th end-side pitches are smaller than an average pitch will be described.

FIG. 11 is a diagram illustrating an example of a pitch of the comb electrode fingers 11a and 11b.

In Example 10, an example in which a tenth end-side pitch is smaller than an average pitch is illustrated. Specifically, the tenth end-side pitch is, for example, about 0.98 times an average value (1.000) of the remaining pitches obtained by excluding the tenth end-side pitch from all the pitches of the plurality of comb electrode fingers 11a and 11b.

In Example 11, an example in which a ninth end-side pitch, a tenth end-side pitch, and an eleventh end-side pitch are smaller than an average pitch is illustrated. Specifically, each of the ninth end-side pitch to the eleventh end-side pitch is, for example, about 0.9933 times an average value (1.000) of the remaining pitches obtained by excluding the ninth end-side pitch to the eleventh end-side pitch from all the pitches of the plurality of comb electrode fingers 11a and 11b.

In Example 12, an example is illustrated in which an eighth end-side pitch, a ninth end-side pitch, a tenth end-side pitch, an eleventh end-side pitch, and a twelfth end-side pitch are smaller than an average pitch. Specifically, each of the eighth end-side pitch to the twelfth end-side pitch is, for example, about 0.9960 times an average value (1.000) of the remaining pitches obtained by excluding the eighth end-side pitch to the twelfth end-side pitch from all the pitches of the plurality of comb electrode fingers 11a and 11b.

That is, in Example 10 to 12, the IDT electrode 11 has one or a plurality of n-th end-side pitches disposed in order in the acoustic wave propagation direction, and the n-th end-side pitch has a relationship represented by (Formula 5) below.

$$n\text{-th end-side pitch}=1-(\text{distance shortened by adopting one or a plurality of }n\text{-th end-side pitches}/\text{number of }n\text{-th end-side pitches}) \quad \text{(Formula 5)}$$

In (Formula 5), the distance shortened by adopting one or the plurality of n-th end-side pitches is a distance that becomes short in a case where some pitches of the plurality of comb electrode fingers 11a and 11b are set as one or the plurality of n-th end-side pitches, by using a distance at both ends of the original plurality of comb electrode fingers 11a and 11b as a reference.

For example, in the case of Example 10, the tenth end-side pitch is calculated by 1−(0.02/1)=0.98. In the case of Example 11, each of the ninth end-side pitch to the eleventh end-side pitch is calculated by 1−(0.02/3)=0.9933. In the case of Example 12, each of the eighth end-side pitch to the twelfth end-side pitch is calculated by 1−(0.02/5)=0.9960.

In the acoustic wave element 10 having such a pitch of the comb electrode fingers 11a and 11b, the ripple generated on the low-frequency side of the resonant frequency of the acoustic wave element 10 can be reduced or prevented.

1. 7 Example 13

Example 13 will be described with reference to FIG. 12. In Example 13, an example in which a pitch of the adjacent comb electrode fingers 11a and 11b is configured to be changed randomly will be described.

FIG. 12 is a diagram illustrating another example of the pitch of the comb electrode fingers 11a and 11b of the IDT electrode 11 and the reflective electrode finger 12a of the reflector 12.

A horizontal axis in FIG. 12 indicates the number of the comb electrode fingers 11a and 11b counted from an end of the IDT electrode 11, and a vertical axis indicates a pitch of the comb electrode fingers 11a and 11b. The vertical axis is a pitch when an average pitch is set to 1 p.

As illustrated in FIG. 12, the plurality of comb electrode fingers 11a and 11b are arranged such that adjacent pitches in the acoustic wave propagation direction are irregularly increased and decreased. That is, the plurality of comb electrode fingers 11a and 11b are randomly disposed such that the pitch of the adjacent comb electrode fingers 11a and 11b is irregularly changed. The irregular change is a meaning that includes a random change without including a constant state, a proportional change, and a periodic change.

For example, among the plurality of n-th end-side pitches, adjacent pitches in the acoustic wave propagation direction may be irregularly increased and decreased. For example, among the plurality of m-th inner-side pitches, adjacent pitches in the acoustic wave propagation direction may be irregularly increased and decreased.

In the acoustic wave element 10 having such a pitch of the comb electrode fingers 11a and 11b, the ripple generated on the low-frequency side of the resonant frequency of the acoustic wave element 10 can be reduced or prevented.

Example Embodiment 2

In Example Embodiment 2 of the present invention, an acoustic wave filter device using the acoustic wave element 10 according to Example Embodiment 1 will be described. By providing the acoustic wave filter device to include the acoustic wave element 10 according to Example Embodiment 1, it is possible to prevent a deterioration of an insertion loss in a pass band.

FIG. 13 is a diagram illustrating a circuit configuration of an acoustic wave filter device 1 according to Example Embodiment 2. FIG. 14 is a diagram illustrating electrode parameters of the acoustic wave element 10 of the acoustic wave filter device 1. Regarding an intersection width in FIG. 14, when a direction in which a plurality of electrode fingers extends is set as an electrode finger extending direction, a region in which adjacent electrode fingers overlap with each other in a direction perpendicular or substantially perpendicular to the electrode finger extending direction is an intersection region, and a dimension of the intersection region along the electrode finger extending direction is the intersection width.

As illustrated in FIGS. 13 and 14, the acoustic wave filter device 1 includes a first input and output terminal 50 and a second input and output terminal 60, series arm resonators S1, S2, S3, and S4 connected between the first input and output terminal 50 and the second input and output terminal 60, parallel arm resonators P1, P2, P3, and P4 connected to a node on a path connecting the first input and output terminal 50 and the second input and output terminal 60 and to a ground. The acoustic wave element 10 according to Example Embodiment 1 is used for each of the series arm resonators S1 to S4.

FIGS. 15A and 15B are graphs comparing bandpass characteristics of acoustic wave filter devices according to Example Embodiment 2 and Comparative Example 2. In the acoustic wave filter device of Comparative Example 2, all the pitches of the plurality of comb electrode fingers of the IDT electrode of the acoustic wave element are the same or substantially the same.

As illustrated in FIGS. 15A and 15B, when the bandpass characteristics of Comparative Example 2 and the bandpass characteristics of Example Embodiment 2 are compared, the insertion loss in Example Embodiment 2 is smaller than the insertion loss in Comparative Example 2. In this manner, in the acoustic wave filter device 1 of the present example embodiment, it is possible to prevent the deterioration of the insertion loss in a pass band.

Example Embodiment 3

FIG. 16 is a circuit configuration diagram of a multiplexer 5 according to Example Embodiment 3 of the present invention and a peripheral circuit (antenna 4) of the multiplexer 5. The multiplexer 5 illustrated in FIG. 16 includes the acoustic wave filter device 1, a filter 3, a common terminal 70, and input and output terminals 81 and 82.

Regarding the acoustic wave filter device 1, the input and output terminal 50 of the acoustic wave filter device 1 is connected to the common terminal 70, and the input and output terminal 60 of the acoustic wave filter device 1 is connected to the input and output terminal 81.

The filter 3 is connected to the common terminal 70 and the input and output terminal 82. The filter 3 is, for example, a ladder acoustic wave filter including a parallel arm resonator and a series arm resonator. Meanwhile, the filter 3 may be an LC filter or the like, and the circuit configuration thereof is not particularly limited.

Here, a pass band of the acoustic wave filter device 1 is located on a low-frequency side of a pass band of the filter 3.

In some cases, the acoustic wave filter device 1 and the filter 3 is not directly connected to the common terminal 70 as illustrated in FIG. 16, and may be indirectly connected to the common terminal 70 with, for example, an impedance matching circuit, a phase shifter, a circulator, or a switch element capable of selecting two or more filters therebetween.

In addition, in the present example embodiment, as the multiplexer 5, the circuit configuration in which, for example, two filters are connected to the common terminal 70 is used. Meanwhile, the number of filters connected to the common terminal 70 is not limited to two, and may be three or more. That is, the multiplexer according to the present embodiment includes a plurality of filters including the acoustic wave filter device 1, and one of an input terminal and an output terminal of each of the plurality of filters may be directly or indirectly connected to a common terminal, and at least one of the plurality of filters other than the acoustic wave filter device 1 may have a pass band higher than a frequency of a pass band of the acoustic wave filter device 1.

SUMMARY

The acoustic wave element 10 according to the present example embodiment is an acoustic wave element that propagates a high-frequency signal in a predetermined acoustic wave propagation direction, and includes the piezoelectric substrate 100, the IDT electrode 11 including the pair of comb-shaped electrodes 11A and 11B, and the reflector 12 disposed adjacent to the IDT electrode 11 in the acoustic wave propagation direction, which are provided on the piezoelectric substrate 100. The comb-shaped electrodes 11A and 11B include the plurality of comb electrode fingers 11a and 11b extending in a direction that intersects with the acoustic wave propagation direction. The reflector 12 includes the plurality of reflective electrode fingers 12a extending in the direction that intersects with the acoustic wave propagation direction. When among the electrode fingers of each of the IDT electrode 11 and the reflector 12, an inter-center distance in the acoustic wave propagation direction between adjacent electrode fingers is set as a pitch, an average value of all pitches of the plurality of comb electrode fingers 11a is smaller than an average value of all pitches of the plurality of reflective electrode fingers 12a. When the total number of the plurality of comb electrode fingers 11a and 11b is set as N, a comb electrode finger closest to the reflector 12 among the plurality of comb electrode fingers 11a and 11b is set as a first end-side electrode finger, electrode fingers in a direction from the first end-side electrode finger toward a center of the IDT electrode 11 are sequentially set as an n-th end-side electrode finger (n is a natural number), and a pitch between the n-th end-side electrode finger and the (n+1)-th end-side electrode finger is set as an n-th end-side pitch:

$$1 \le n \le (0.233 \times N) \qquad \text{(Formula 1A)}.$$

At least one n-th end-side pitch satisfying (Formula 1A) is smaller than the average value of all the pitches of the plurality of comb electrode fingers 11a and 11b.

According to present example embodiment, a pitch of at least one set of comb electrode fingers 11a and 11b adjacent to each other at a position spaced away from an end of the IDT electrode 11 is smaller than the average value (average pitch) of all the pitches of the plurality of comb electrode fingers 11a and 11b. A position of the pitch of the at least one set of comb electrode fingers 11a and 11b is defined in a range illustrated in (Formula 1A) above. Since the acoustic wave element 10 has this configuration, the ripple generated on the low-frequency side of the resonant frequency of the acoustic wave element 10 can be reduced or prevented.

Further, when in a case where N is an odd number, an (N/2−0.5)-th end-side electrode finger is set as a first inner-side electrode finger and in a case where N is an even number, an (N/2)-th end-side electrode finger is set as the first inner-side electrode finger, electrode fingers in a direction from the first inner-side electrode finger toward the reflector 12 are sequentially set as an m-th inner-side electrode finger (m is a natural number), and a pitch between the m-th inner-side electrode finger and the (m−1)-th inner-side electrode finger is set as an m-th inner-side pitch:

$$1 \le m \le (0.167 \times N) \qquad \text{(Formula 2A)}.$$

At least one m-th inner-side pitch satisfying (Formula 2A) may be larger than the average value of all the pitches of the plurality of comb electrode fingers 11a and 11b.

According to the present example embodiment, a pitch of at least one set of comb electrode fingers 11a and 11b adjacent to each other at a position spaced away from a center of the IDT electrode 11 is larger than the average value (average pitch) of all the pitches of the plurality of comb electrode fingers 11a and 11b. A position of the pitch of the at least one set of comb electrode fingers 11a and 11b is defined in a range illustrated in (Formula 2A) above. Since the acoustic wave element 10 has this configuration, the ripple generated on the low-frequency side of the resonant frequency of the acoustic wave element 10 can be reduced or prevented.

The acoustic wave element 10 according to the present example embodiment is an acoustic wave element that propagates a high-frequency signal in a predetermined acoustic wave propagation direction, and includes the piezoelectric substrate 100, the IDT electrode 11 including the pair of comb-shaped electrodes 11A and 11B, and the reflector 12 disposed adjacent to the IDT electrode 11 in the acoustic wave propagation direction, which are provided on the piezoelectric substrate 100. The comb-shaped electrodes 11A and 11B have the plurality of comb electrode fingers 11a and 11b extending in a direction that intersects with the acoustic wave propagation direction. The reflector 12 includes the plurality of reflective electrode fingers 12a extending in the direction that intersects with the acoustic wave propagation direction. When among the electrode fingers of each of the IDT electrode 11 and the reflector 12, an inter-center distance in the acoustic wave propagation direction between adjacent electrode fingers is set as a pitch, an average value of all pitches of the plurality of comb electrode fingers 11a and 11b is smaller than an average value of all pitches of the plurality of reflective electrode fingers 12a. When the total number of the plurality of comb electrode fingers 11a and 11b is set as N, a comb electrode finger closest to the reflector 12 among the plurality of comb electrode fingers 11a and 11b is set as a first end-side electrode finger, electrode fingers in a direction from the first end-side electrode finger toward a center of the IDT electrode 11 are sequentially set as an n-th end-side electrode finger (n is a natural number), in a case where N is an odd number, an (N/2-0.5)-th end-side electrode finger is set as a first inner-side electrode finger and in a case where N is an even number, an (N/2)-th end-side electrode finger is set as the first inner-side electrode finger, electrode fingers in a direction from the first inner-side electrode finger toward the reflector 12 are sequentially set as an m-th inner-side electrode finger (m is a natural number), and a pitch between the m-th inner-side electrode finger and the (m−1)-th inner-side electrode finger is set as an m-th inner-side pitch:

$$1 \leq m \leq (0.167 \times N) \qquad \text{(Formula 2A).}$$

At least one m-th inner-side pitch satisfying (Formula 2A) is larger than the average value of all the pitches of the plurality of comb electrode fingers 11a and 11b.

According to this, a pitch of at least one set of comb electrode fingers 11a and 11b adjacent to each other at a position spaced away from a center of the IDT electrode 11 is larger than the average value (average pitch) of all the pitches of the plurality of comb electrode fingers 11a and 11b. A position of the pitch of the at least one set of comb electrode fingers 11a and 11b is defined in a range illustrated in (Formula 2A) above. Since the acoustic wave element 10 has this configuration, the ripple generated on the low-frequency side of the resonant frequency of the acoustic wave element 10 can be reduced or prevented.

Further, when a pitch between the n-th end-side electrode finger and the (n+1)-th end-side electrode finger is set as an n-th end-side pitch:

$$1 \leq n \leq (0.233 \times N) \qquad \text{(Formula 1A)}$$

At least one n-th end-side pitch satisfying (Formula 1A) may be smaller than the average value of all the pitches of the plurality of comb electrode fingers 11a and 11b.

According to this, a pitch of at least one set of comb electrode fingers 11a and 11b adjacent to each other at a position spaced away from an end of the IDT electrode 11 is smaller than the average value (average pitch) of all the pitches of the plurality of comb electrode fingers 11a and 11b. A position of the pitch of the at least one set of comb electrode fingers 11a and 11b is defined in a range illustrated in (Formula 1A) above. Since the acoustic wave element 10 has this configuration, the ripple generated on the low-frequency side of the resonant frequency of the acoustic wave element 10 can be reduced.

Further, the acoustic wave element 10 includes at least one n-th end-side pitch satisfying Formula, $1 \leq n \leq (0.132 \times N)$ . . . (Formula 3B), and the at least one n-th end-side pitch may be smaller than the average value of all the pitches of the plurality of comb electrode fingers 11a and 11b.

According to this, a pitch of at least one set of comb electrode fingers 11a and 11b adjacent to each other at a position spaced away from an end of the IDT electrode 11 is smaller than the average value (average pitch) of all the pitches of the plurality of comb electrode fingers 11a and 11b. A position of the pitch of the at least one set of comb electrode fingers 11a and 11b is defined in a range illustrated in (Formula 3B) above. Since the acoustic wave element 10 has this configuration, the ripple generated on the low-frequency side of the resonant frequency of the acoustic wave element 10 can be reduced.

Further, the acoustic wave element 10 includes a plurality of n-th end-side pitches satisfying Formula 3B, $1 \leq n \leq (0.132 \times N)$ . . . (Formula 3B), and each of the plurality of n-th end-side pitches may be smaller than an average value of all the pitches of the plurality of comb electrode fingers 11a and 11b.

According to this, pitches of a plurality of sets of comb electrode fingers 11a and 11b adjacent to each other at a position spaced away from an end of the IDT electrode 11 are smaller than the average value (average pitch) of all the pitches of the plurality of comb electrode fingers 11a and 11b. Positions of the pitches of the plurality of sets of comb electrode fingers 11a and 11b are defined in a range illustrated in (Formula 3B) above. Since the acoustic wave element 10 has this configuration, the ripple generated on the low-frequency side of the resonant frequency of the acoustic wave element 10 can be reduced.

Further, the acoustic wave element 10 includes at least one m-th inner-side pitch satisfying Formula, $2 \leq m \leq (0.104 \times N)$ . . . (Formula 4B), and the at least one m-th inner-side pitch may be larger than an average value of all the pitches of the plurality of comb electrode fingers 11a and 11b.

According to this, a pitch of at least one set of comb electrode fingers 11a and 11b adjacent to each other at a position spaced away from a center of the IDT electrode 11 is larger than the average value (average pitch) of all the pitches of the plurality of comb electrode fingers 11a and 11b. A position of the pitch of the at least one set of comb electrode fingers 11a and 11b is defined in a range illustrated in (Formula 4B) above. Since the acoustic wave element 10 has this configuration, the ripple generated on the low-frequency side of the resonant frequency of the acoustic wave element 10 can be reduced.

Further, the acoustic wave element 10 includes a plurality of m-th inner-side pitches satisfying Formula 4B, $2 \leq m \leq (0.104 \times N)$ . . . (Formula 4B), and each of the plurality of m-th inner-side pitches may be larger than an average value of all the pitches of the plurality of comb electrode fingers 11a and 11b.

According to this, pitches of a plurality of sets of comb electrode fingers 11a and 11b adjacent to each other at a position spaced away from a center of the IDT electrode 11 are larger than the average value (average pitch) of all the pitches of the plurality of comb electrode fingers 11a and 11b. Positions of the pitches of the plurality of sets of comb electrode fingers 11a and 11b are defined in a range illustrated in (Formula 4B) above. Since the acoustic wave element 10 has this configuration, the ripple generated on the low-frequency side of the resonant frequency of the acoustic wave element 10 can be reduced.

Further, the acoustic wave element 10 has a plurality of n-th end-side pitches satisfying (Formula 1A), and the plurality of n-th end-side pitches may be located to be line-symmetric with respect to a center line passing through a center of the IDT electrode 11 in the acoustic wave propagation direction.

With this configuration, the plurality of n-th end-side pitches have a simple structure, and a ripple generated on a low-frequency side of a resonant frequency of the acoustic wave element 10 can be reduced.

Further, the acoustic wave element 10 has a plurality of m-th inner-side pitches satisfying (Formula 2A), and the plurality of m-th inner-side pitches may be located to be line-symmetric with respect to the center line passing through the center of the IDT electrode 11 in the acoustic wave propagation direction.

With this configuration, the plurality of m-th inner-side pitches have a simple structure, and a ripple generated on the low-frequency side of the resonant frequency of the acoustic wave element 10 can be reduced.

Further, the plurality of comb electrode fingers 11a and 11b may be arranged to be line-symmetric with respect to the center line passing through the center of the IDT electrode 11 in the acoustic wave propagation direction.

With this configuration, the IDT electrode 11 has a simple structure, and a ripple generated on the low-frequency side of the resonant frequency of the acoustic wave element 10 can be reduced.

In addition, the acoustic wave element 10 has a plurality of n-th end-side pitches satisfying (Formula 1A), and among the plurality of n-th end-side pitches, adjacent pitches in the acoustic wave propagation direction may be irregularly increased and decreased.

In this manner, since the adjacent pitches among the plurality of n-th end-side pitches are irregularly increased and decreased, a ripple generated on the low-frequency side of the resonant frequency of the acoustic wave element 10 can be reduced.

Further, the acoustic wave element 10 may have a plurality of m-th inner-side pitches satisfying (Formula 2A), and among the plurality of m-th inner-side pitches, adjacent pitches in the acoustic wave propagation direction may be irregularly increased and decreased.

In this manner, since the adjacent pitches among the plurality of m-th inner-side pitches are irregularly increased and decreased, a ripple generated on the low-frequency side of the resonant frequency of the acoustic wave element 10 can be reduced.

In addition, an inter-center distance in the acoustic wave propagation direction between the reflective electrode finger 12a closest to the IDT electrode 11 and the comb electrode finger closest to the reflector 12 may be 0.9 times or less of a repetition pitch of the plurality of reflective electrode fingers 12a.

With this configuration, a return loss on the low-frequency side of the resonant frequency of the acoustic wave element 10 can be further reduced.

The acoustic wave filter device 1 according to the present example embodiment includes the acoustic wave element 10 described above.

According to this, it is possible to provide the acoustic wave filter device 1 including the acoustic wave element 10 in which a ripple generated on the low-frequency side of the resonant frequency is reduced.

Further, the acoustic wave filter device 1 further includes the first input and output terminal 50 and the second input and output terminal 60, and the parallel arm resonators P1 to P4 connected to a node on a path connecting the first input and output terminal 50 and the second input and output terminal 60 and to a ground, and the acoustic wave element 10 may be the series arm resonators S1 to S4 connected between the first input and output terminal 50 and the second input and output terminal 60.

According to the above configuration, the acoustic wave filter device 1 defines a ladder acoustic wave filter including the series arm resonators S1 to S4 and the parallel arm resonators P1 to P4, and the acoustic wave element 10 is applied to the series arm resonators S1 to S4. Therefore, it is possible to reduce or prevent an increase in the insertion loss on the low-frequency side of the resonant frequency of the series arm resonators S1 to S4 defining a pass band of the acoustic wave filter device 1.

The multiplexer 5 according to the present example embodiment includes a plurality of filters including the acoustic wave filter device 1, and one of an input terminal and an output terminal of each of the plurality of filters may be directly or indirectly connected to the common terminal 70, and at least one of the plurality of filters other than the acoustic wave filter device 1 may have a pass band higher than a frequency of the pass band of the acoustic wave filter device 1.

Therefore, in the acoustic wave filter device 1, an attenuation in an attenuation bandwidth on the high-frequency side of the pass band can be enlarged, and thus, an insertion loss within the pass band of the filter having the pass band on the high-frequency side of the pass band of the acoustic wave filter device 1 can be reduced or prevented.

The acoustic wave element 10 according to the present example embodiment includes the piezoelectric substrate 100, the IDT electrode 11 including the pair of comb-shaped electrodes 11A and 11B, and the reflector 12 disposed adjacent to the IDT electrode 11, which are provided on the piezoelectric substrate 100. The comb-shaped electrode 11A and 11B includes the plurality of comb electrode fingers 11a and 11b extending in the first direction d1. The reflector 12 includes the plurality of reflective electrode fingers 12a extending in the first direction d1, and is disposed adjacent to the IDT electrode 11 in a second direction d2 that intersects with the first direction d1. When among the electrode fingers of each of the IDT electrode 11 and the reflector 12, an inter-center distance between adjacent electrode fingers in the second direction d2 is set as a pitch, an average value of all pitches of the plurality of comb electrode fingers 11a is smaller than an average value of all pitches of the plurality of reflective electrode fingers 12a. When the total number of the plurality of comb electrode fingers 11a and 11b is set as N, a comb electrode finger closest to the reflector 12 among the plurality of comb electrode fingers 11a and 11b is set as a first end-side electrode finger, electrode fingers in a direction from the first end-side electrode finger toward a center of the IDT electrode 11 are sequentially set as an n-th end-side electrode finger (n is a natural number), and a pitch between the n-th end-side electrode finger and the (n+1)-th end-side electrode finger is set as an n-th end-side pitch:

$$1 \leq n \leq (0.233 \times N) \qquad \text{(Formula 1A)}.$$

At least one n-th end-side pitch satisfying (Formula 1A) is smaller than the average value of all the pitches of the plurality of comb electrode fingers 11*a* and 11*b*.

According to the present example embodiment, a pitch of at least one set of comb electrode fingers 11*a* and 11*b* adjacent to each other at a position spaced away from an end of the IDT electrode 11 is smaller than the average value (average pitch) of all the pitches of the plurality of comb electrode fingers 11*a* and 11*b*. A position of the pitch of the at least one set of comb electrode fingers 11*a* and 11*b* is defined in a range illustrated in (Formula 1A) above. Since the acoustic wave element 10 has this configuration, the ripple generated on the low-frequency side of the resonant frequency of the acoustic wave element 10 can be reduced or prevented.

The acoustic wave element 10 according to the present example embodiment includes the piezoelectric substrate 100, the IDT electrode 11 including the pair of comb-shaped electrodes 11A and 11B, and the reflector 12 disposed adjacent to the IDT electrode 11, which are provided on the piezoelectric substrate 100. The comb-shaped electrode 11A and 11B includes the plurality of comb electrode fingers 11*a* and 11*b* extending in the first direction d1. The reflector 12 includes the plurality of reflective electrode fingers 12*a* extending in the first direction d1, and is disposed adjacent to the IDT electrode 11 in a second direction d2 that intersects with the first direction d1. When among the electrode fingers of each of the IDT electrode 11 and the reflector 12, an inter-center distance between adjacent electrode fingers in the second direction d2 is set as a pitch, an average value of all pitches of the plurality of comb electrode fingers 11*a* and 11*b* is smaller than an average value of all pitches of the plurality of reflective electrode fingers 12*a*. When the total number of the plurality of comb electrode fingers 11*a* and 11*b* is set as N, a comb electrode finger closest to the reflector 12 among the plurality of comb electrode fingers 11*a* and 11*b* is set as a first end-side electrode finger, electrode fingers in a direction from the first end-side electrode finger toward a center of the IDT electrode 11 are sequentially set as an n-th end-side electrode finger (n is a natural number), in a case where N is an odd number, an (N/2−0.5)-th end-side electrode finger is set as a first inner-side electrode finger and in a case where N is an even number, an (N/2)-th end-side electrode finger is set as the first inner-side electrode finger, electrode fingers in a direction from the first inner-side electrode finger toward the reflector 12 are sequentially set as an m-th inner-side electrode finger (m is a natural number), and a pitch between the m-th inner-side electrode finger and the (m−1)-th inner-side electrode finger is set as an m-th inner-side pitch, $$1 \leq m \leq (0.167 \times N) \qquad \text{(Formula 2A)}.$$

At least one m-th inner-side pitch satisfying (Formula 2A) is larger than the average value of all the pitches of the plurality of comb electrode fingers 11*a* and 11*b*.

According to this, a pitch of at least one set of comb electrode fingers 11*a* and 11*b* adjacent to each other at a position spaced away from a center of the IDT electrode 11 is larger than the average value (average pitch) of all the pitches of the plurality of comb electrode fingers 11*a* and 11*b*. A position of the pitch of the at least one set of comb electrode fingers 11*a* and 11*b* is defined in a range illustrated in (Formula 2A) above. Since the acoustic wave element 10 has this configuration, the ripple generated on the low-frequency side of the resonant frequency of the acoustic wave element 10 can be reduced.

Other Example Embodiments

Although the acoustic wave elements, the acoustic wave filter devices, and the multiplexers according to example embodiments of the present invention are described above by using the example embodiments and the examples, the acoustic wave elements, the acoustic wave filter devices, and the multiplexers of the present invention are not limited to the example embodiments and examples described above. Another example embodiment that is obtained by combining any component in the example embodiments and examples described above, another example obtained by executing various modifications by a person skilled in the art on the example embodiments described above within a range that does not deviate from the scope of the present invention, or various types of equipment including the acoustic wave elements, the acoustic wave filter devices, and the multiplexers according to example embodiments of the present invention therein.

For example, the acoustic wave filter device 1 according to an example embodiment the present invention may further include a circuit element such as an inductor or a capacitor, for example.

Further, in some cases, acoustic wave elements according to example embodiments of the present invention may not be the surface acoustic wave resonator as in Example Embodiment 1, and may be an acoustic wave resonator using a boundary acoustic wave, for example.

Example embodiments of the present invention can be widely used, for example, in communication equipment such as a mobile phone, as a low-loss and small acoustic wave element, an acoustic wave filter device, and a multiplexer that can be applied to multi-band and multi-mode frequency standards.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave element comprising:
   a piezoelectric substrate;
   an interdigital transducer (IDT) electrode on the piezoelectric substrate and including a pair of comb-shaped electrodes; and
   a reflector adjacent to the IDT electrode in an acoustic wave propagation direction; wherein
   each of the pair of comb-shaped electrodes includes a plurality of comb electrode fingers extending in a direction intersecting with the acoustic wave propagation direction;
   the reflector includes a plurality of reflective electrode fingers extending in the direction intersecting with the acoustic wave propagation direction;
   when an inter-center distance in the acoustic wave propagation direction between adjacent electrode fingers among the electrode fingers of each of the IDT electrode and the reflector is defined as a pitch, an average value of all pitches of the plurality of comb electrode fingers is smaller than an average value of all pitches of the plurality of reflective electrode fingers; and
   when a total number of the plurality of comb electrode fingers is defined as N, the comb electrode finger closest to the reflector among the plurality of comb electrode fingers is defined as a first end-side electrode finger, electrode fingers in a direction from the first end-side electrode finger toward a center of the IDT electrode are sequentially defined as an n-th end-side electrode finger where n is a natural number, a pitch between the n-th end-side electrode finger and an (n+1)-th end-side electrode finger is defined as an n-th end-side pitch, in a case where N is an odd number, an (N/2−0.5)-th end-side electrode finger is set as a first inner-side electrode finger and in a case where N is an even number, an (N/2)-th end-side electrode finger is defined as the first inner-side electrode finger; electrode fingers in a direction from the first inner-side electrode finger toward the reflector are sequentially defined as an m-th inner-side electrode finger where m is a natural number, a pitch between the m-th inner-side electrode finger and an (m−1)-th inner-side electrode finger is defined as an m-th inner-side pitch, and an average value of all pitches of an electrode finger that is the n-th end-side electrode finger satisfying n>0.233×N and is also the m-th inner-side electrode finger satisfying m>0.167×N among the plurality of comb electrode fingers is set as a reference pitch, and at least one m-th inner-side pitch satisfying Formula 2A below is larger than the reference pitch:

$$1 \le m \le (0.167 \times N) \qquad \text{Formula 2A.}$$

2. The acoustic wave element according to claim 1, wherein at least one n-th end-side pitch satisfying Formula 1A below is smaller than the reference pitch:

$$1 \le n \le (0.233 \times N) \qquad \text{Formula 1A.}$$

3. The acoustic wave element according to claim 2, wherein the acoustic wave element includes at least one n-th end-side pitch satisfying Formula 3B below; and
the at least one n-th end-side pitch is smaller than the average value of all the pitches of the plurality of comb electrode fingers:

$$1 \le n \le (0.132 \times N) \qquad \text{Formula 3B.}$$

4. The acoustic wave element according to claim 2, wherein the acoustic wave element includes a plurality of n-th end-side pitches satisfying Formula 3B below, each of which being the n-th end-side pitch; and
each of the plurality of n-th end-side pitches is smaller than the average value of all the pitches of the plurality of comb electrode fingers:

$$1 \le n \le (0.132 \times N) \qquad \text{Formula 3B.}$$

5. The acoustic wave element according to claim 2, wherein the acoustic wave element includes at least one m-th inner-side pitch satisfying Formula 4B below; and
the at least one m-th inner-side pitch is larger than the average value of all the pitches of the plurality of comb electrode fingers:

$$2 \le m \le (0.104 \times N) \qquad \text{Formula 4B.}$$

6. The acoustic wave element according to claim 2, wherein the acoustic wave element includes a plurality of m-th inner-side pitches satisfying Formula 4B below, each of which being the m-th inner-side pitch; and each of the plurality of m-th inner-side pitches is larger than the average value of all the pitches of the plurality of comb electrode fingers:

$$2 \le m \le (0.104 \times N) \qquad \text{Formula 4B.}$$

7. The acoustic wave element according to claim 2, wherein the acoustic wave element includes a plurality of n-th end-side pitches satisfying Formula 1A, each of which being the n-th end-side pitch; and
the plurality of n-th end-side pitches are line-symmetric with respect to a center line passing through the center of the IDT electrode in the acoustic wave propagation direction.

8. The acoustic wave element according to claim 2, wherein the acoustic wave element includes plurality of m-th inner-side pitches satisfying Formula 2A, each of which being the m-th inner-side pitch; and
the plurality of m-th inner-side pitches are line-symmetric with respect to a center line passing through the center of the IDT electrode in the acoustic wave propagation direction.

9. The acoustic wave element according to claim 2, wherein the acoustic wave element includes a plurality of m-th inner-side pitches satisfying Formula 2A, each of which being the m-th inner-side pitch; and
among the plurality of m-th inner-side pitches, adjacent pitches in the acoustic wave propagation direction are irregularly increased and decreased.

10. The acoustic wave element according to claim 2, wherein the acoustic wave element includes a plurality of n-th end-side pitches satisfying Formula 1A, each of which being the n-th end-side pitch; and
among the plurality of n-th end-side pitches, adjacent pitches in the acoustic wave propagation direction are irregularly increased and decreased.

11. The acoustic wave element according to claim 1, wherein the plurality of comb electrode fingers are line-symmetric with respect to a center line passing through the center of the IDT electrode in the acoustic wave propagation direction.

12. The acoustic wave element according to claim 1, wherein an inter-center distance in the acoustic wave propagation direction between the reflective electrode finger closest to the IDT electrode and the comb electrode finger closest to the reflector is about 0.9 times or less of a repetition pitch of the plurality of reflective electrode fingers.

13. An acoustic wave filter device comprising:
the acoustic wave element according to claim 1.

14. The acoustic wave filter device according to claim 13, further comprising:

a first input and output terminal and a second input and output terminal; and
a parallel arm resonator connected to a node on a path connecting the first input and output terminal and the second input and output terminal and to a ground; wherein
the acoustic wave element is a series arm resonator connected between the first input and output terminal and the second input and output terminal.

15. A multiplexer comprising:
a plurality of filters including the acoustic wave filter device according to claim 14; wherein one of an input terminal and an output terminal of each of the plurality of filters is directly or indirectly connected to a common terminal; and at least one of the plurality of filters except for the acoustic wave filter device has a pass band higher than a frequency of a pass band of the acoustic wave filter device.

16. An acoustic wave element comprising:

a piezoelectric substrate;

an interdigital transducer (IDT) electrode on the piezo-electric substrate and including a pair of comb-shaped electrodes; and a reflector adjacent to the IDT electrode; wherein each of the pair of comb-shaped electrodes includes a plurality of comb electrode fingers extending in a first direction;

the reflector includes a plurality of reflective electrode fingers extending in the first direction, and is adjacent to the IDT electrode in a second direction intersecting with the first direction;

when an inter-center distance between adjacent electrode fingers in the second direction among the electrode fingers of each of the IDT electrode and the reflector is defined as a pitch, an average value of all pitches of the plurality of comb electrode fingers is smaller than an average value of all pitches of the plurality of reflective electrode fingers; and when a total number of the plurality of comb electrode fingers is defined as N, the comb electrode finger closest to the reflector among the plurality of comb electrode fingers is defined as a first end-side electrode finger, electrode fingers in a direction from the first end-side electrode finger toward a center of the IDT electrode are sequentially defined as an n-th end-side electrode finger where n is a natural number, in a case where N is an odd number, an (N/2−0.5)-th end-side electrode finger is defined as a first inner-side electrode finger and in a case where N is an even number, an (N/2)-th end-side electrode finger is defined as the first inner-side electrode finger, electrode fingers in a direction from the first inner-side electrode finger toward the reflector are sequentially defined as an m-th inner-side electrode finger where m is a natural number, and a pitch between the m-th inner-side electrode finger and an (m−1)-th inner-side electrode finger is defined as an m-th inner-side pitch, at least one m-th inner-side pitch satisfying Formula 2A below is larger than the average value of all the pitches of the plurality of comb electrode fingers:

$$1 \le m \le (0.167 \times N) \qquad \text{Formula 2A.}$$

* * * * *